United States Patent
Mariani et al.

(10) Patent No.: US 11,557,591 B2
(45) Date of Patent: Jan. 17, 2023

(54) TRANSISTORS, MEMORY ARRAYS, AND METHODS USED IN FORMING AN ARRAY OF MEMORY CELLS INDIVIDUALLY COMPRISING A TRANSISTOR

(71) Applicant: Micron Technology, Inc., Boise, ID (US)

(72) Inventors: Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 16/855,446

(22) Filed: Apr. 22, 2020

(65) Prior Publication Data
US 2021/0335793 A1  Oct. 28, 2021

(51) Int. Cl.
*H01L 27/108* (2006.01)
*H01L 29/66* (2006.01)
(Continued)

(52) U.S. Cl.
CPC ........... *H01L 27/10814* (2013.01); *H01L 21/02236* (2013.01); *H01L 21/308* (2013.01);
(Continued)

(58) Field of Classification Search
None
See application file for complete search history.

(56) References Cited

U.S. PATENT DOCUMENTS

| 5,497,017 | A |   | 3/1996 | Gonzales |
| 5,874,760 | A | * | 2/1999 | Burns, Jr. ........... H01L 29/7883 |
|           |   |   |        | 257/E21.652 |

(Continued)

FOREIGN PATENT DOCUMENTS

| KR | 10-2015-0027363 | 3/2015 |
| WO | WO 2006/022765 | 3/2006 |

(Continued)

*Primary Examiner* — Nicholas J Tobergte
*Assistant Examiner* — Kevin Quinto
(74) *Attorney, Agent, or Firm* — Wells St. John P. S.

(57) ABSTRACT

A method used in forming an array of memory cells comprises forming lines of top-source/drain-region material, bottom-source/drain-region material, and channel-region material vertically there-between in rows in a first direction. The lines are spaced from one another in a second direction. The top-source/drain-region material, bottom-source/drain-region material, and channel-region material have respective opposing sides. The channel-region material on its opposing sides is laterally recessed in the second direction relative to the top-source/drain-region material and the bottom-source/drain-region material on their opposing sides to form a pair of lateral recesses in the opposing sides of the channel-region material in individual of the rows. After the pair of lateral recesses are formed, the lines of the top-source/drain-region material, the channel-region material, and the bottom-source/drain-region material are patterned in the second direction to comprise pillars of individual transistors. Rows of wordlines are formed in the first direction that individually are operatively aside the channel-region material of individual of the pillars in the pairs of lateral recesses and that interconnect the transistors in that individual row. Other embodiments, including structure independent of method, are disclosed.

25 Claims, 33 Drawing Sheets

(51) Int. Cl.
*H01L 21/308* (2006.01)
*H01L 21/02* (2006.01)
*H01L 21/306* (2006.01)
*H01L 29/78* (2006.01)

(52) U.S. Cl.
CPC .. *H01L 21/30604* (2013.01); *H01L 27/10873* (2013.01); *H01L 29/66666* (2013.01); *H01L 29/7827* (2013.01)

(56) References Cited

U.S. PATENT DOCUMENTS

| | | | |
|---|---|---|---|
| 9,786,784 B1 * | 10/2017 | Song | H01L 21/30604 |
| 2004/0125629 A1 * | 7/2004 | Scheuerlein | G11C 16/0483 365/17 |
| 2005/0253180 A1 | 11/2005 | Schlosser et al. | |
| 2006/0046424 A1 | 3/2006 | Chance et al. | |
| 2007/0290258 A1 * | 12/2007 | Son | H01L 21/26513 257/330 |
| 2010/0032739 A1 | 2/2010 | Lindholm et al. | |
| 2015/0061134 A1 | 3/2015 | Lee et al. | |

FOREIGN PATENT DOCUMENTS

| | | |
|---|---|---|
| WO | PCT/US2021/024045 | 7/2021 |
| WO | PCT/US2021/024045 | 7/2021 |

* cited by examiner

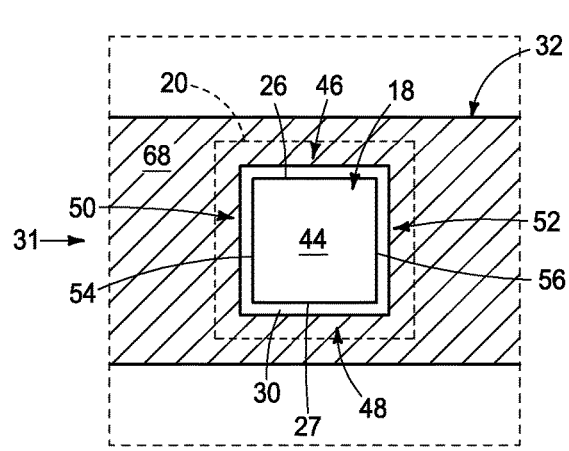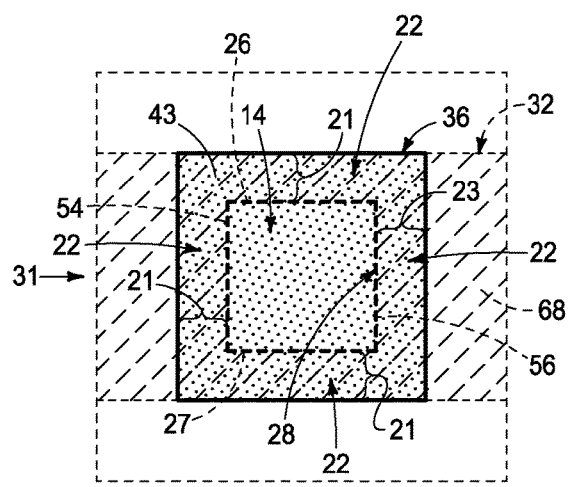
FIG. 47　　　　FIG. 48

TRANSISTORS, MEMORY ARRAYS, AND METHODS USED IN FORMING AN ARRAY OF MEMORY CELLS INDIVIDUALLY COMPRISING A TRANSISTOR

TECHNICAL FIELD

Embodiments disclosed herein pertain to transistors, to memory arrays, and to methods used in forming an array of memory cells individually comprising a transistor.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as gatelines or wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

BRIEF DESCRIPTION OF THE DRAWINGS

FIGS. 4-50 are diagrammatic sequential sectional, expanded, enlarged, and/or partial views of the construction of FIGS. 1-3, or portions thereof, in process in accordance with some embodiments of the invention.

DETAILED DESCRIPTION OF EXAMPLE EMBODIMENTS

Embodiments of the invention include methods used in forming an array of memory cells individually comprising a transistor. Embodiments of the invention also include a transistor and arrays of memory cells that comprise a transistor independent of method of manufacture. First-example method embodiments are described with reference to FIGS. 1-48.

Figure 1:
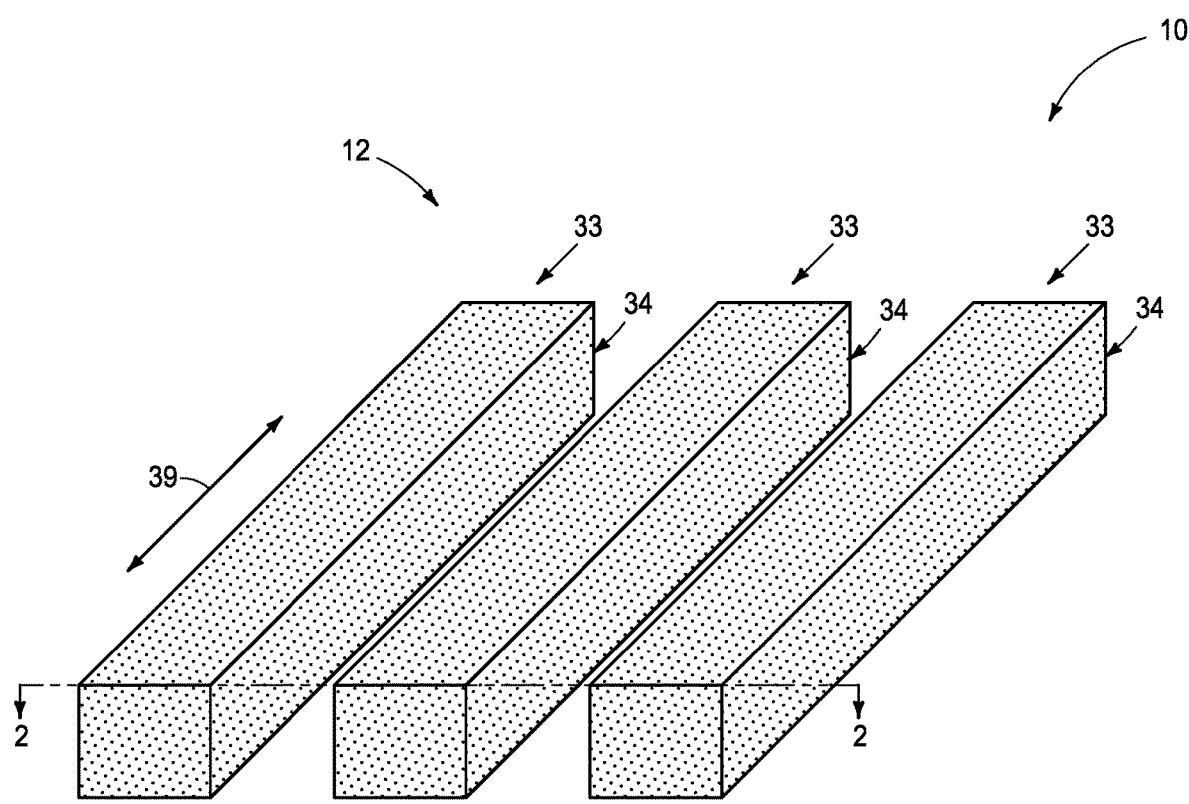
FIG. 1 is a diagrammatic perspective view of a portion of a substrate in process in accordance with an embodiment of the invention.
Figure 2:
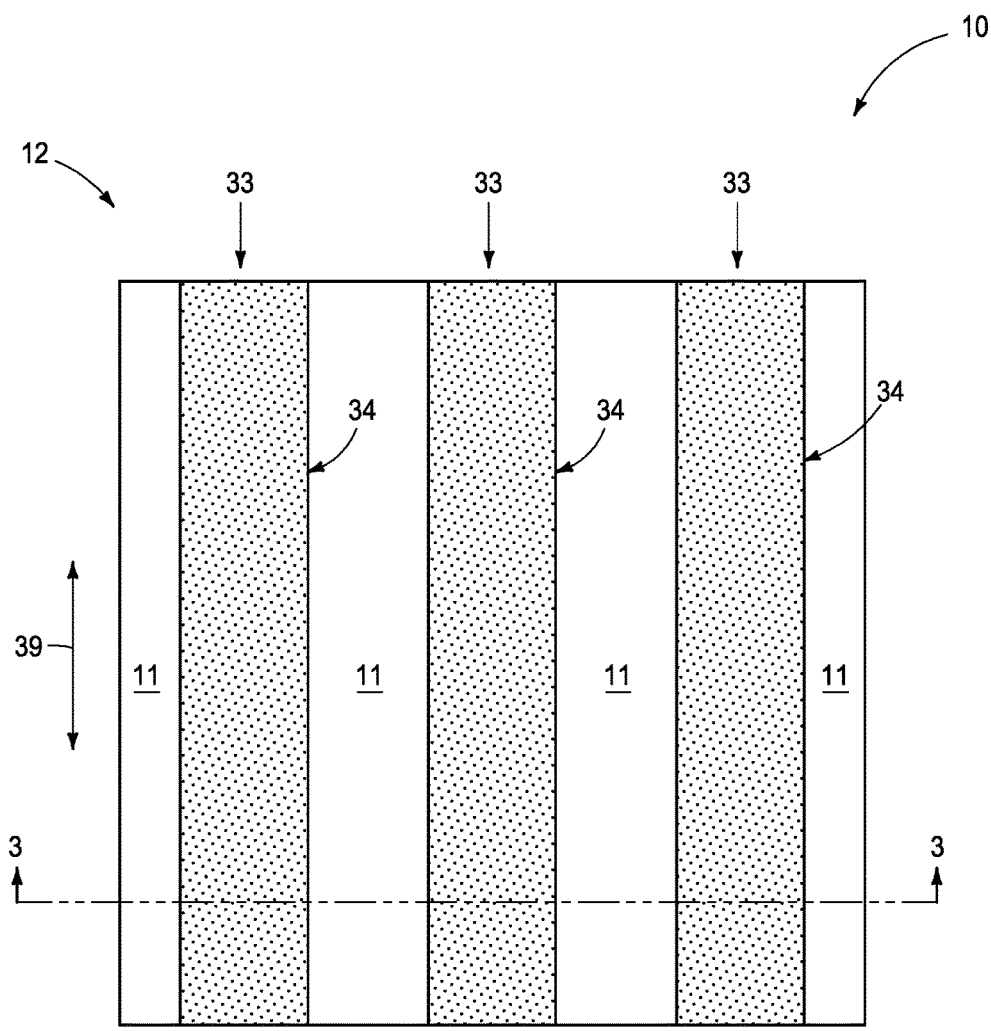
FIG. 2 is a diagrammatic cross-sectional view of the substrate of FIG. 1 and is taken through line 2-2 in FIG. 3.
Figure 3:
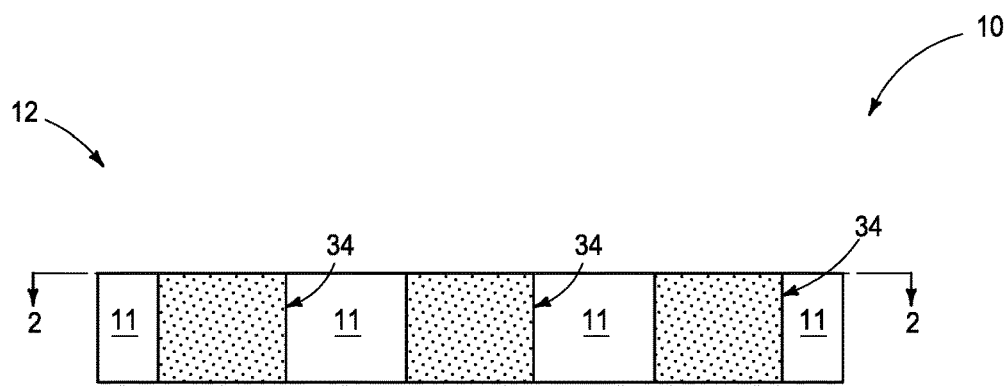
FIG. 3 is a diagrammatic cross-sectional view taken through line 3-3 in FIG. 2.
Figure 4:
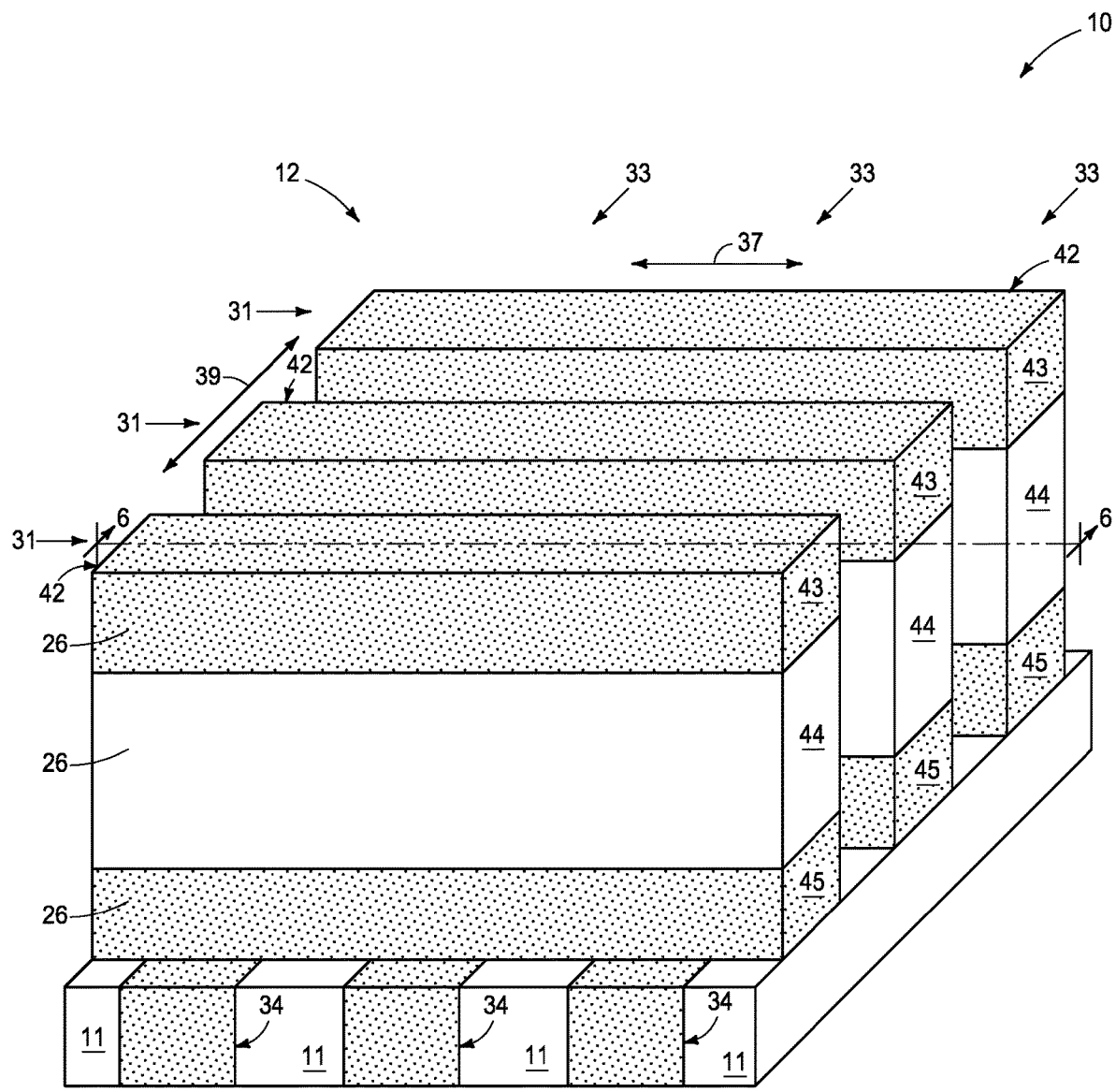
Figure 5:
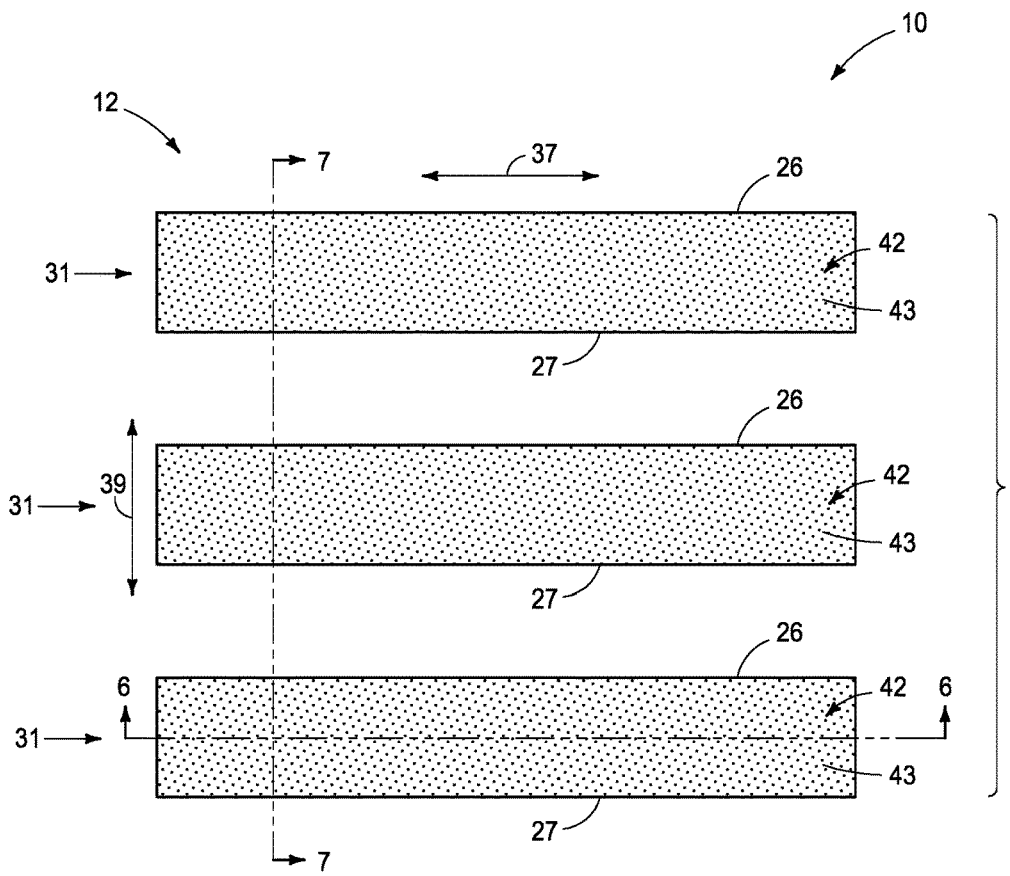
Figure 6:
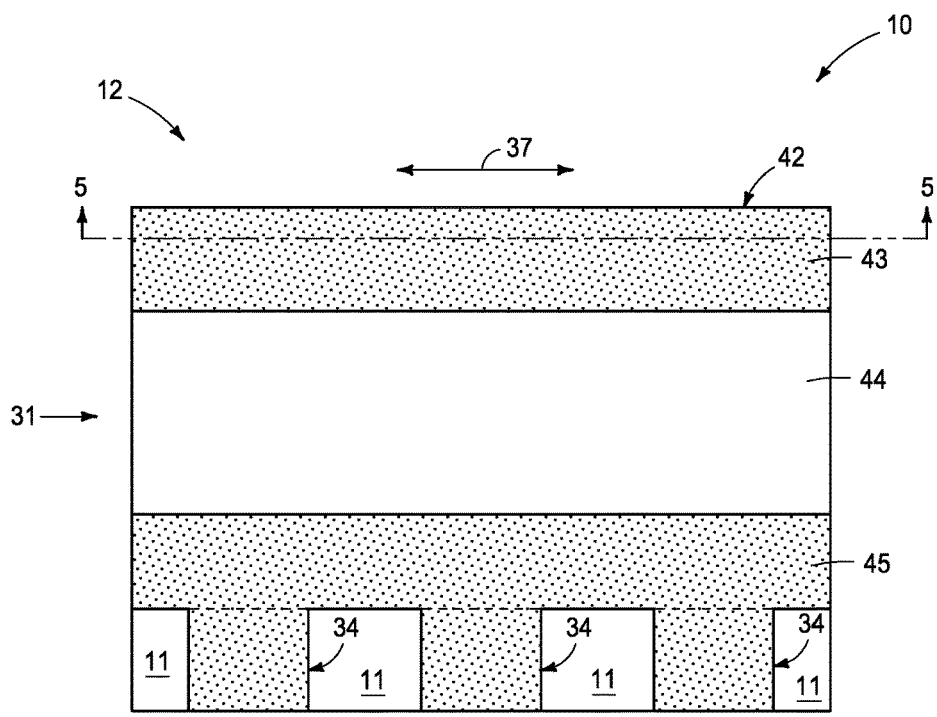
Figure 7:
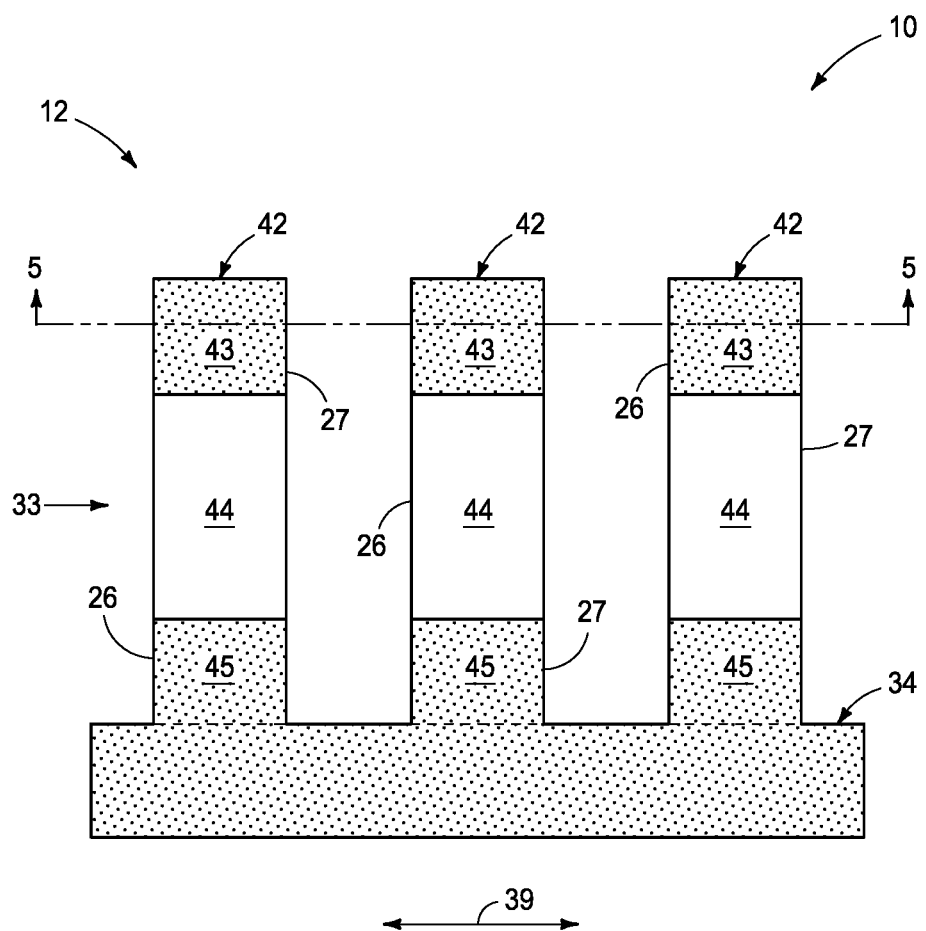

Referring to FIGS. 1-3, an example construction 10 has an array or array area 12 in which memory cells will be formed. Construction 10 may comprise a base substrate (not shown) that may have any one or more of conductive/conductor/conducting, semiconductive/semiconductor/semiconducting, or insulative/insulator/insulating (i.e., electrically herein) materials. Various materials may be considered as having been formed above a base substrate (not shown). Materials may be aside, elevationally inward, or elevationally outward of the FIGS. 1-3-depicted materials. For example, other partially or wholly fabricated components of integrated circuitry may be provided somewhere above, about, or within a base substrate below construction 10. Control and/or other peripheral circuitry for operating components within an array (e.g., array 12) of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array. In one embodiment and as shown, columns 33 of digitlines 34 have been formed in a second direction 39 (e.g., a digitline direction) and between insulating material 11 (e.g., silicon dioxide; insulating material 11 not being shown in FIG. 1 for clarity).

Referring to FIGS. 4-7, lines 42 of top-source/drain-region material 43, bottom-source/drain-region material 45, and channel-region material 44 vertically there-between have been formed in rows 31 in a first direction 37 (e.g., a wordline direction) for formation of transistors. Lines 42 are spaced from one another in second direction 39, Top-source/drain-region material 43, bottom-source/drain-region material 44, and channel-region material 44 have respective opposing sides 26, 27 (in some embodiments referred to as first opposing sides 26, 27). In one embodiment, materials 45, 44, and 43 are in situ doped to their respective dopant concentrations during their respective depositions.

Figure 8:
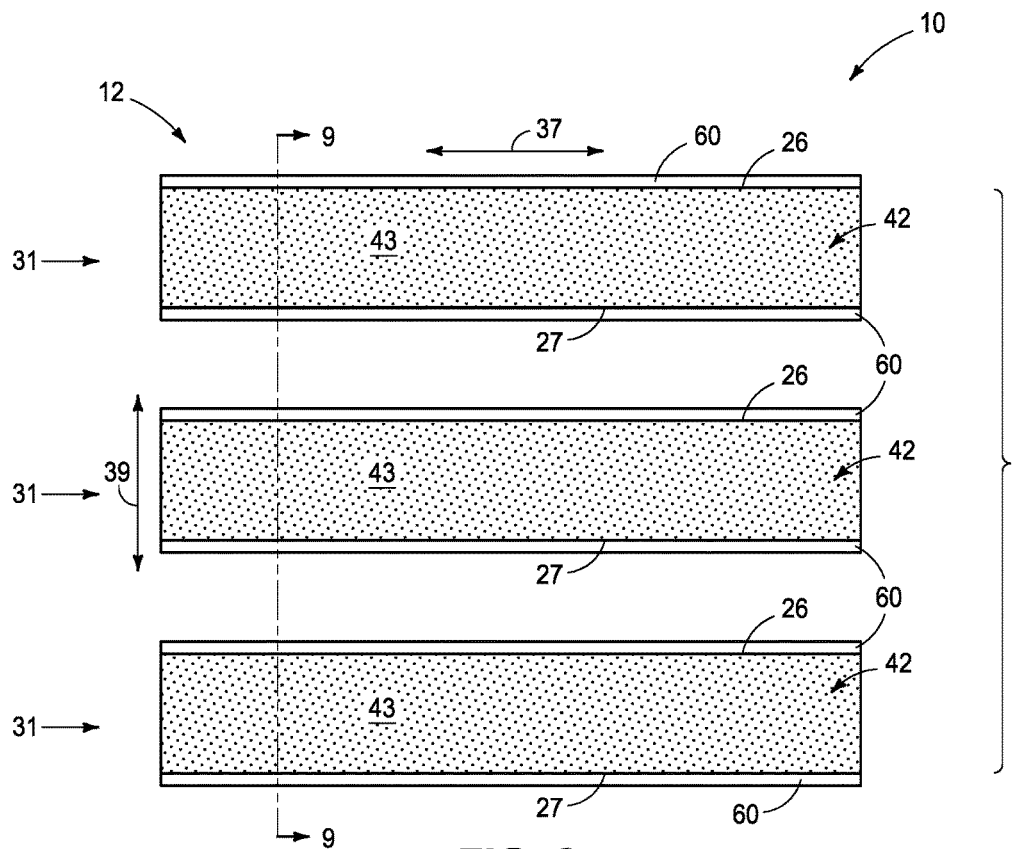
Figure 9:
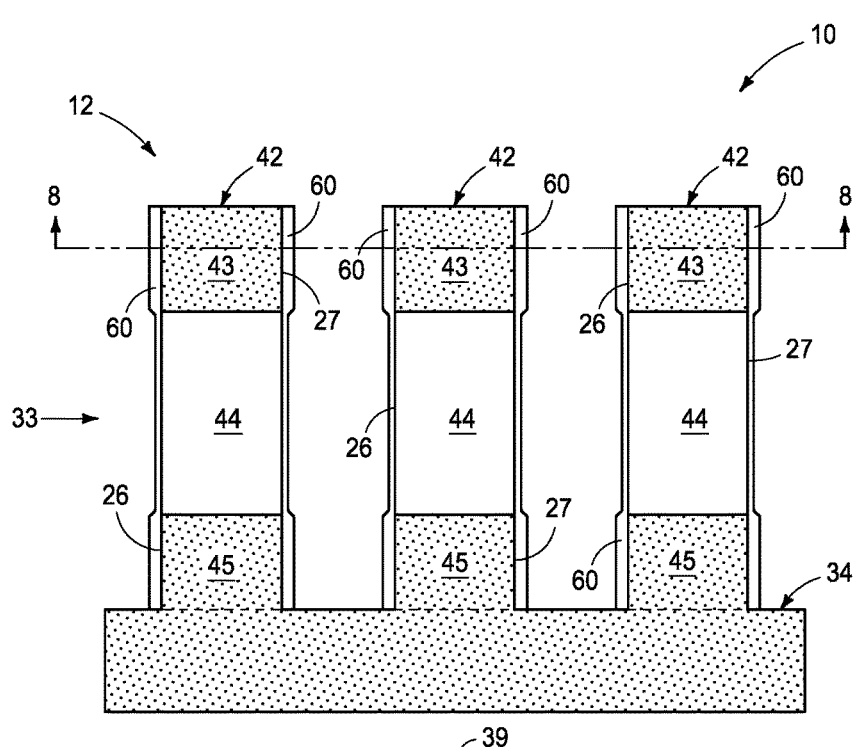

Referring to FIGS. 8 and 9, sacrificial masking material 60 has been formed aside channel-region material 44, top-source/drain-region material 43, and bottom-source/drain-region material 45 on opposing sides 26, 27 of channel-region material 44 in individual rows 31. As shown, sacrificial masking material 60 is laterally-thicker over opposing sides 26, 27 of top and bottom source/drain-region materials 43, 45 than over opposing sides 26, 27 of channel-region material 44. In one embodiment, sacrificial masking material 60 comprises an oxide (e.g., silicon dioxide). In one such example, the forming of sacrificial masking material 60 comprises oxidizing opposing sides 26, 27 of channel-region material 44, top-source/drain-region material 43, and bottom-source/drain-region material 45, with such oxidizing of the top and bottom source/drain-region materials being at a greater rate than rate of oxidizing channel-region material 44. As an example, the top and bottom source/drain-region materials may be heavily-doped silicon and channel-region material 44 may be undoped silicon. Alternately, the top and bottom source/drain-region materials individually may be a combination of silicon and germanium, with channel-region material 44 being undoped silicon (in the absence of significant, if any, germanium). A construction as shown in FIGS. 8 and 9 may result from thermal oxidation, for example and by way of example only, using $O_2$ or $H_2O$ in a furnace at 400° C. to 1,100° C., and at sub-atmospheric, atmospheric, or greater-than-atmospheric pressure. Lateral/Horizontal thickness of materials 43, 44, and 45 may be reduced thereby (not shown).

Figure 10:
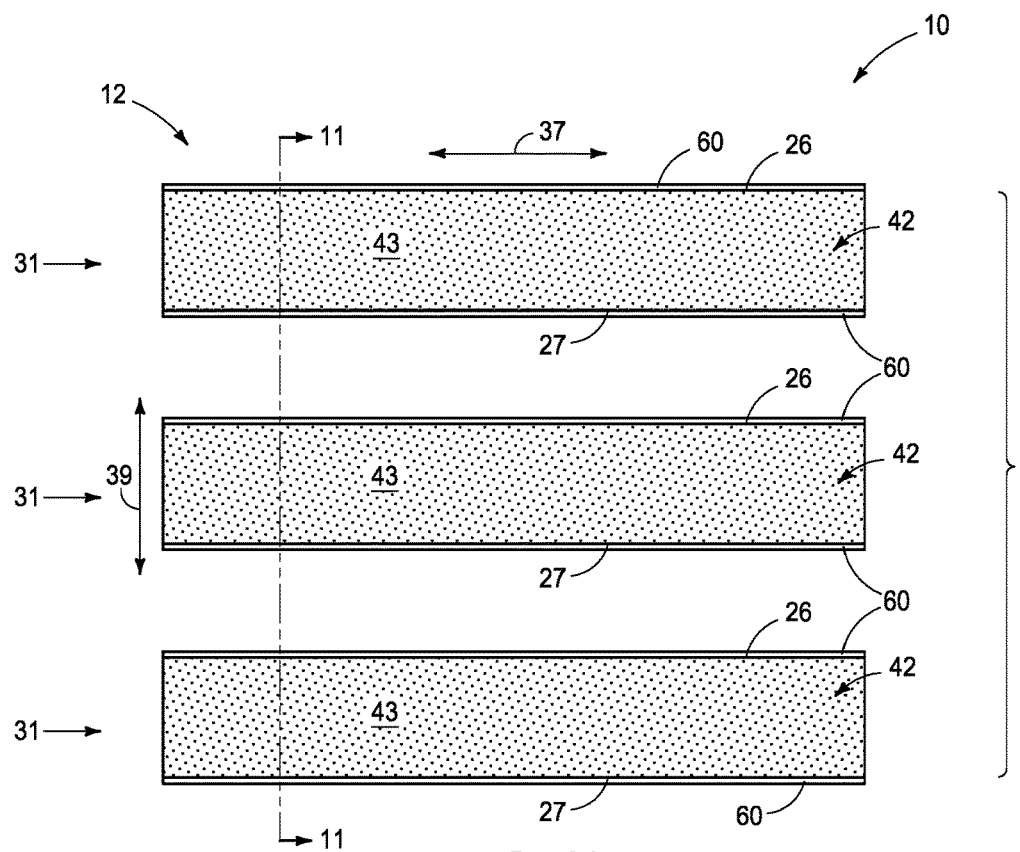
Figure 11:
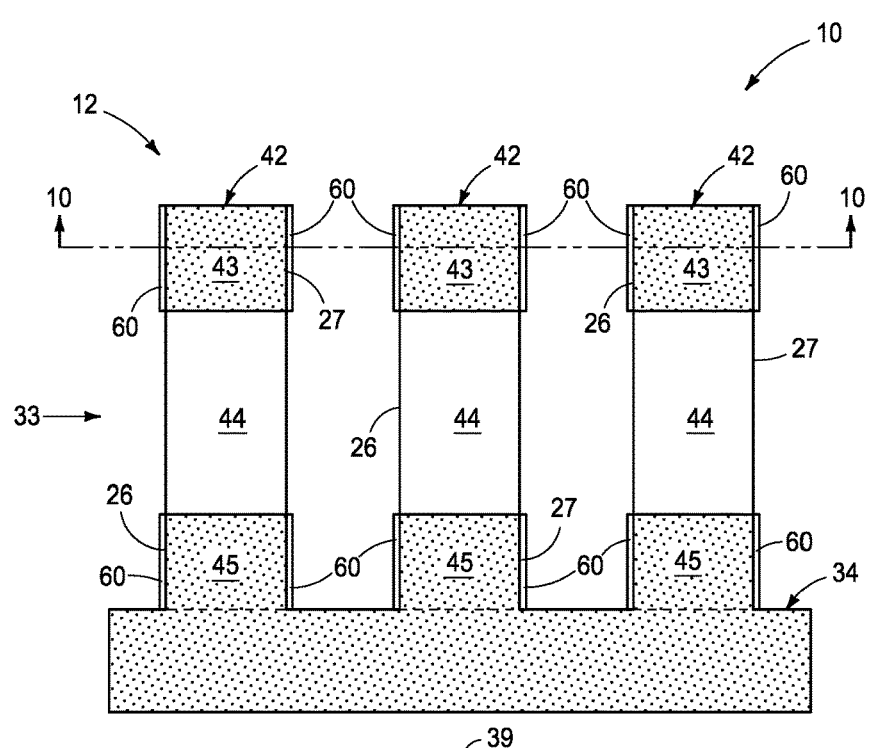
Figure 12:
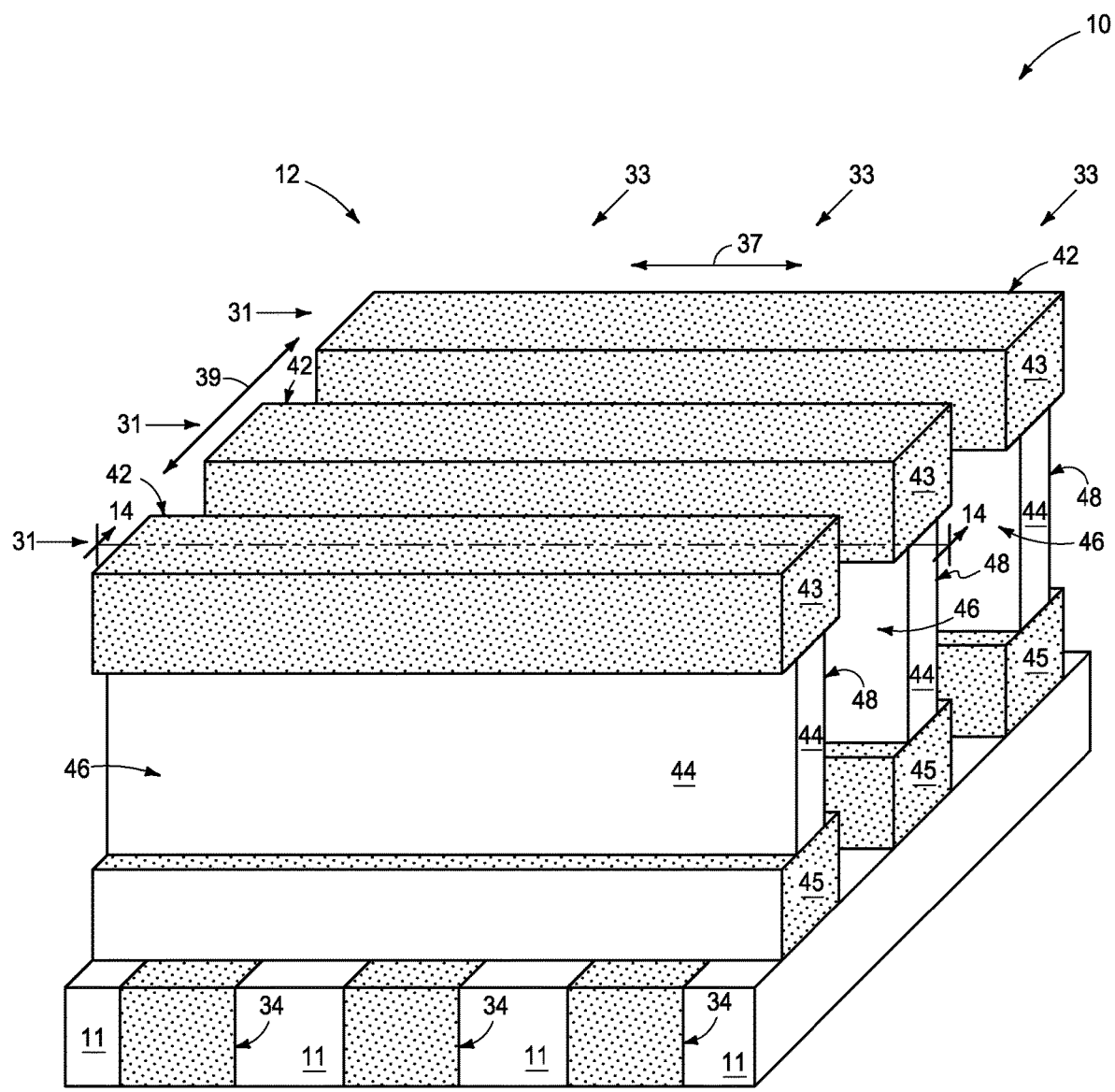
Figure 13:
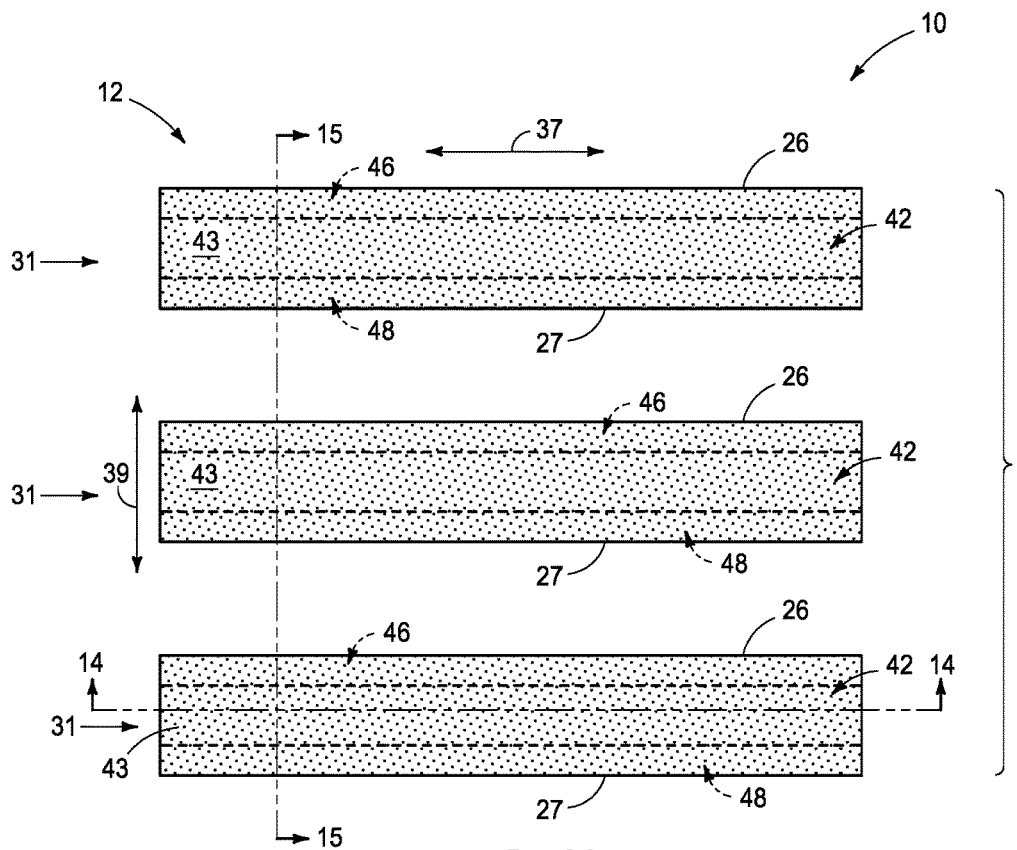
Figure 14:
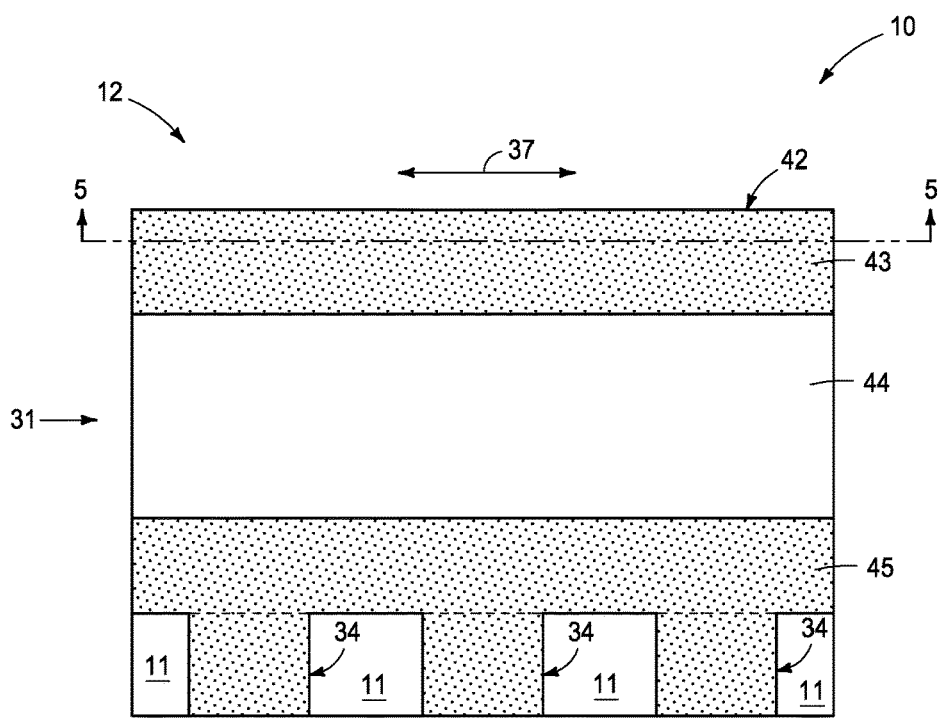
Figure 15:
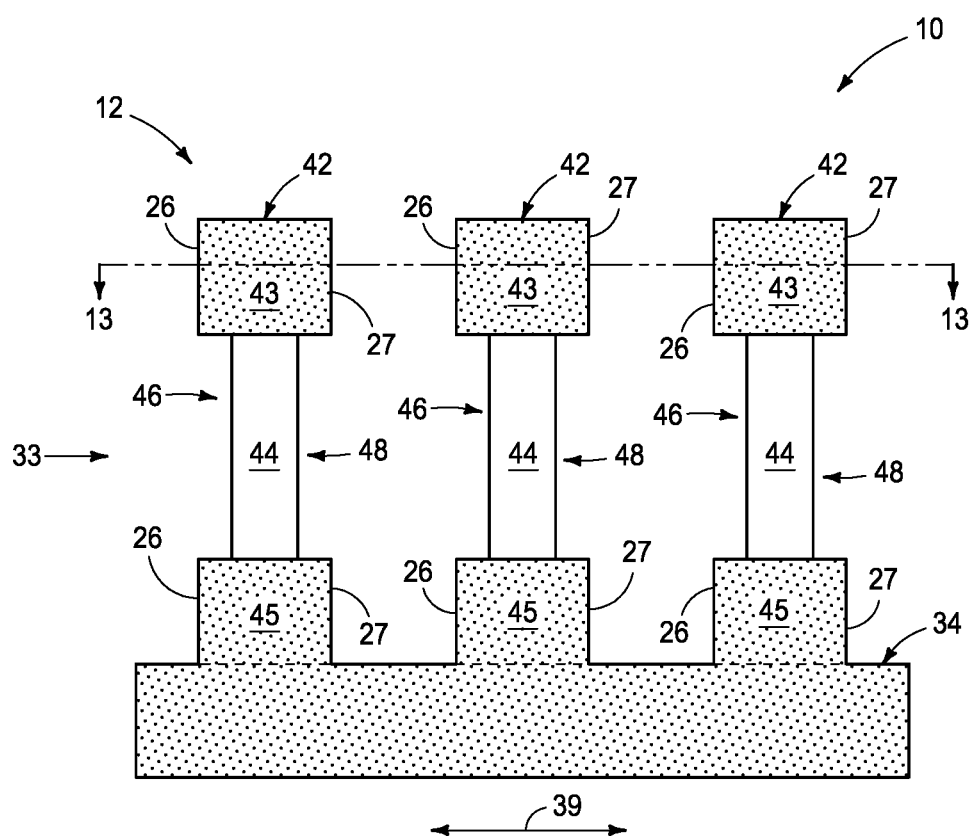

Referring to FIGS. 10 and 11, sacrificial masking material 60 has been removed (e.g., by a short-timed isotropic etching) from being over opposing sides 26, 27 of channel-region material 44 to leave sacrificial masking material 60 over opposing sides 26, 27 of top and bottom source/drain-region materials 43, 45. Such may be conducted, for example, using an HF solution.

Referring to FIGS. 12-15, channel-region material 44 has been etched selectively relative to sacrificial masking material 60 (not shown) that is over opposing sides 26, 27 of top and bottom source/drain-region materials 43, 45 to form a pair (in some embodiments referred to as a first pair) of lateral recesses 46, 48. Sacrificial masking material 60 (not shown) is removed during or after such etching.

The above example processing is but one example method of laterally recessing channel-region material 44 on its opposing sides in second direction 39 relative to top-source/drain-region material 43 and bottom-source/drain-region material 45 to form lateral recesses 46, 48 in first opposing sides 26, 27 of channel-region material 44 in individual rows 31. Any alternate existing or future-developed manners may be used.

Figure 16:
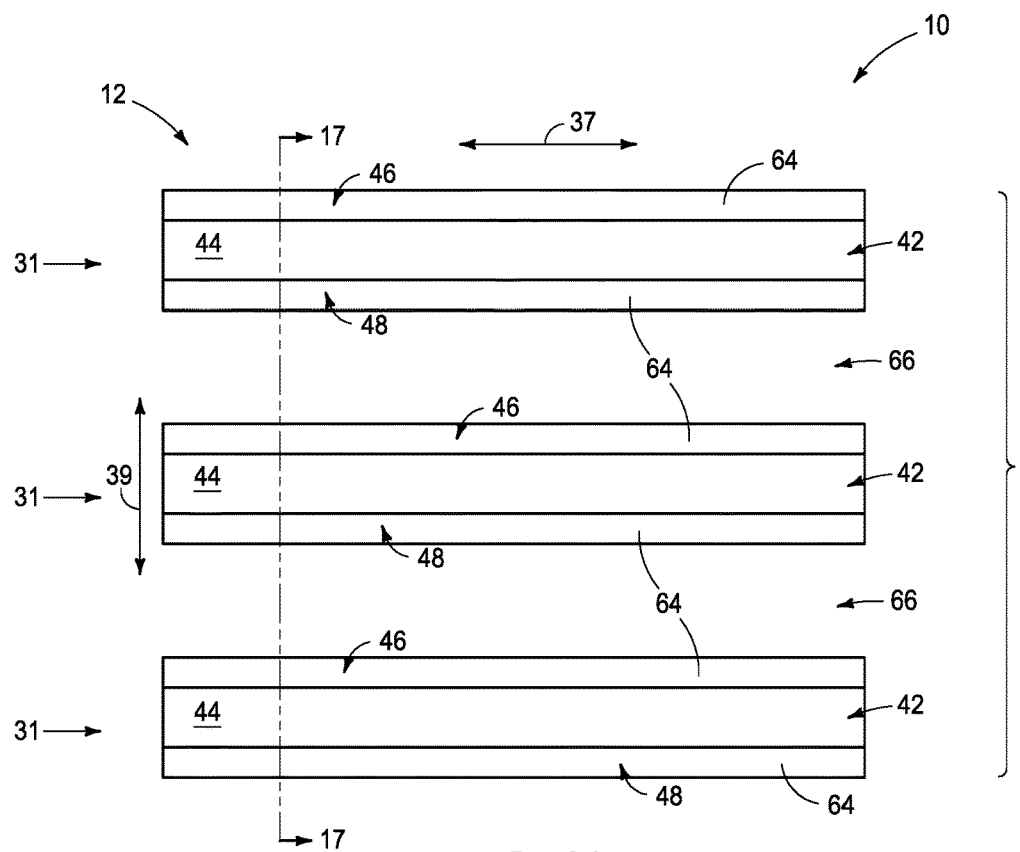
Figure 17:
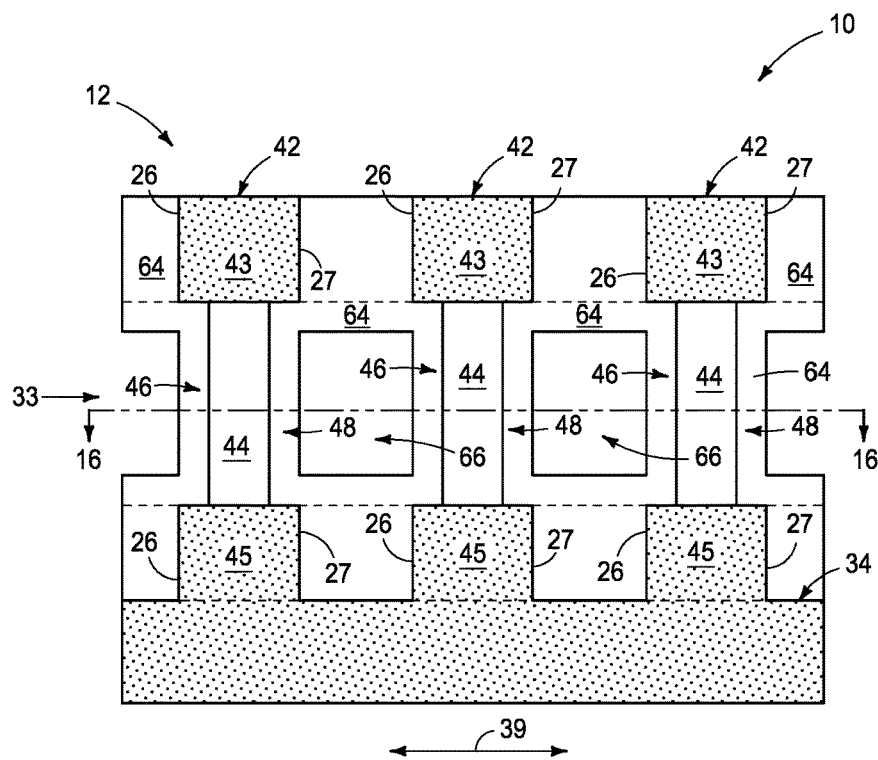

Referring to FIGS. 16 and 17, and in one embodiment, another sacrificial masking material 64 (e.g., silicon dioxide) has been formed to fill lateral recesses 46, 48 and as a liner to form void-spaces 66 (e.g., air gaps). Some of material 64 may remain in a finished construction.

Figure 18:
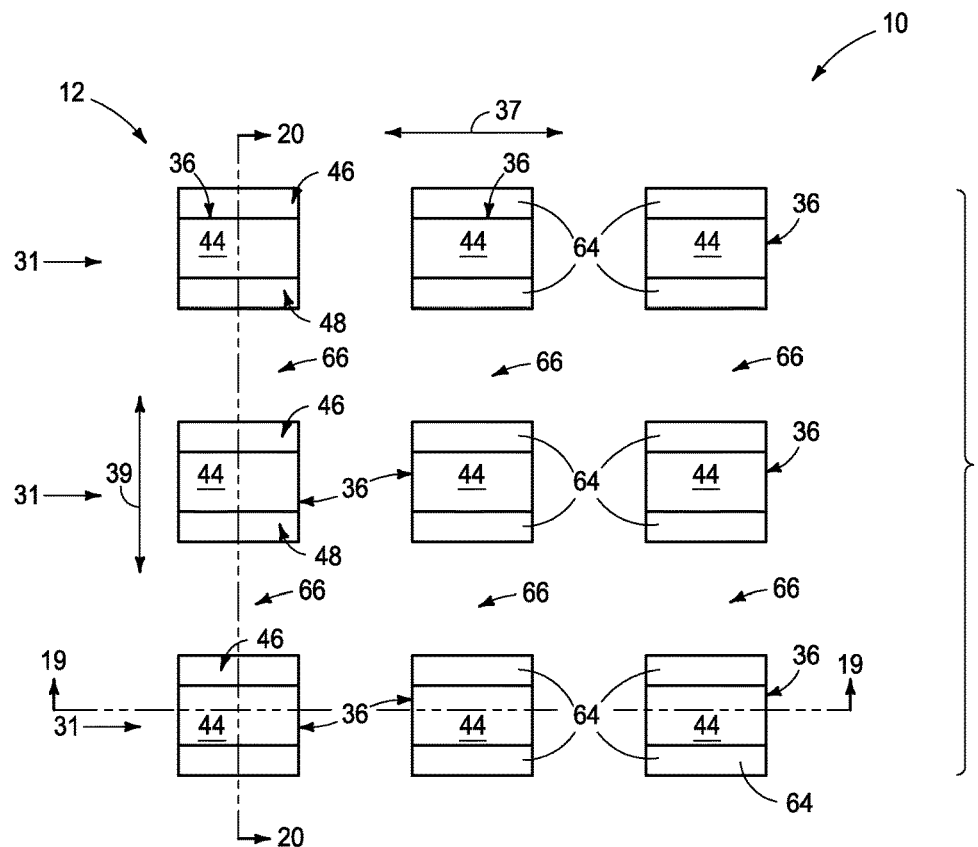
Figure 19:
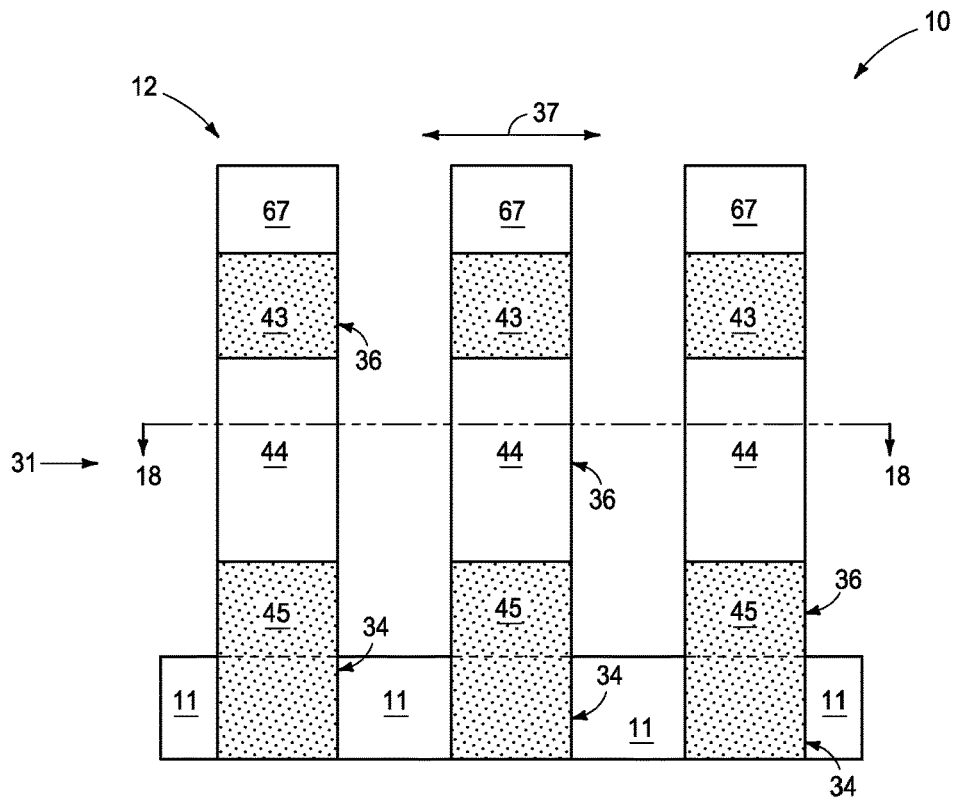
Figure 20:
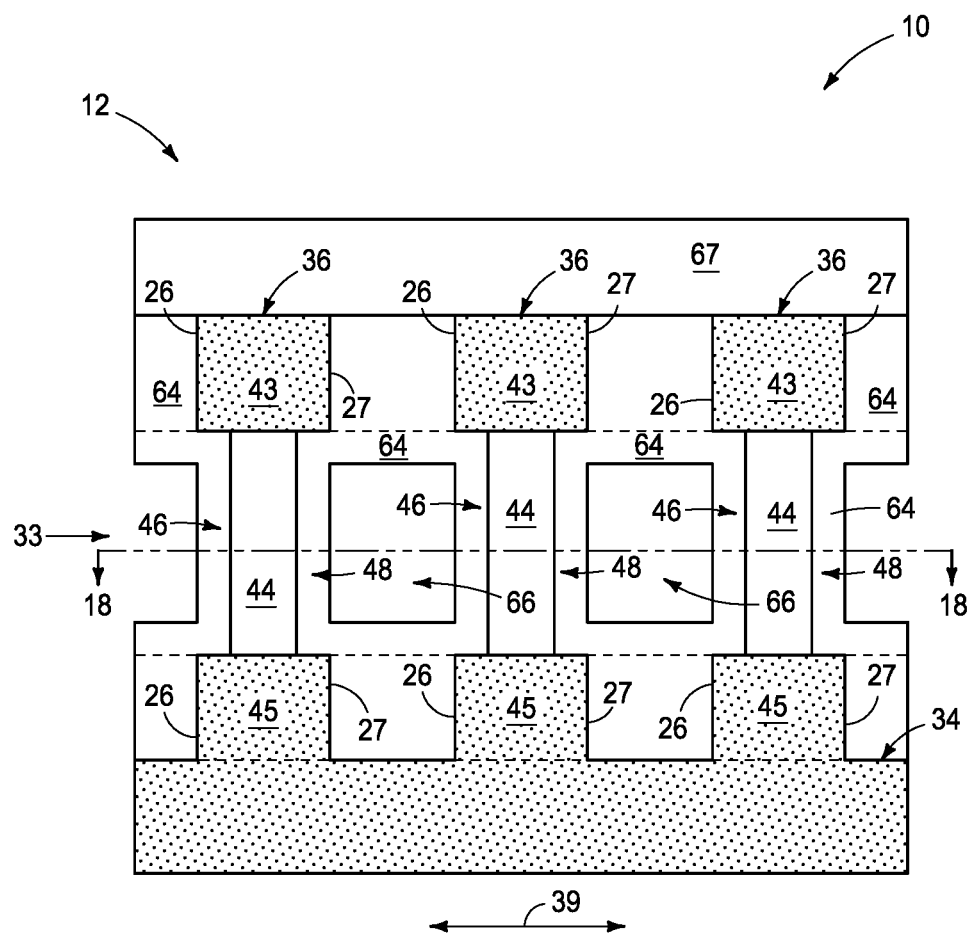

Referring to FIGS. 18-20, lines 42 of top-source/drain-region material 43, channel-region material 44, and bottom-source/drain-region material 45 have been patterned in second direction 39 to form pillars 36 of individual transistors that are being formed. Such may be conducted, by way of example, using photolithography with or without pitch multiplication. An example hard-masking material 67 (e.g., silicon nitride and/or carbon) has been formed atop the construction of FIGS. 16 and 17 prior to such patterning.

Figure 21:
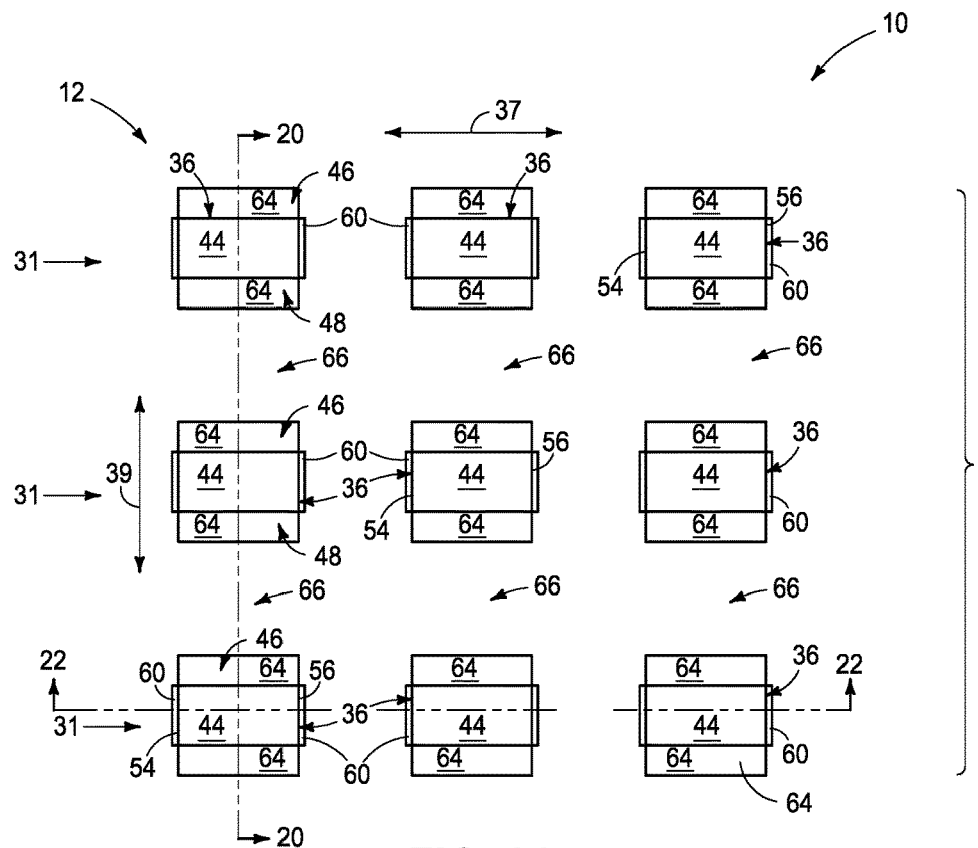
Figure 22:
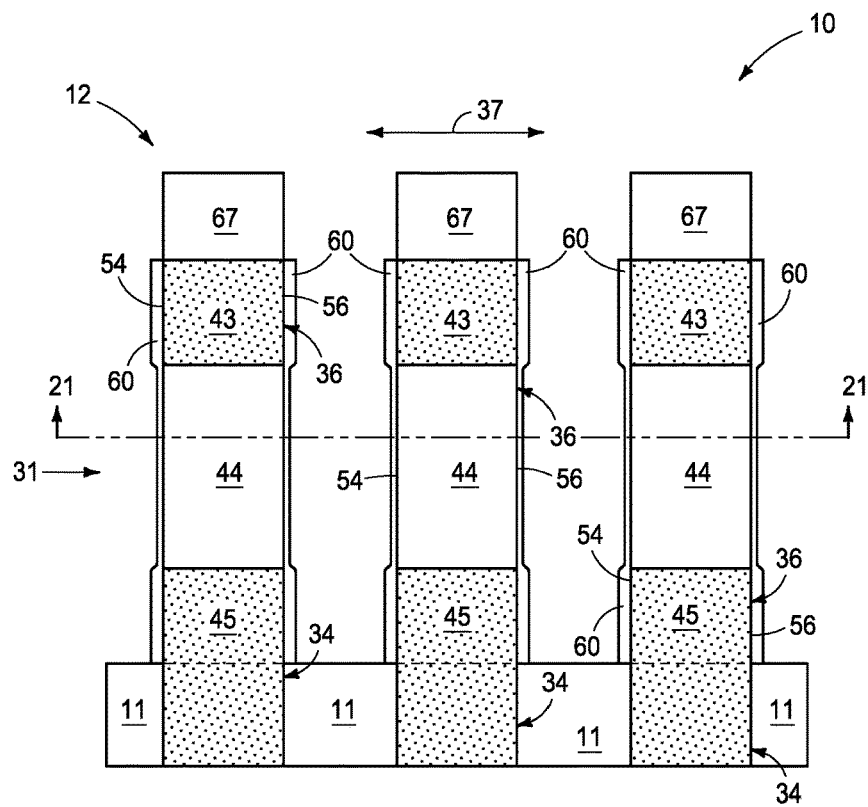
Figure 23:
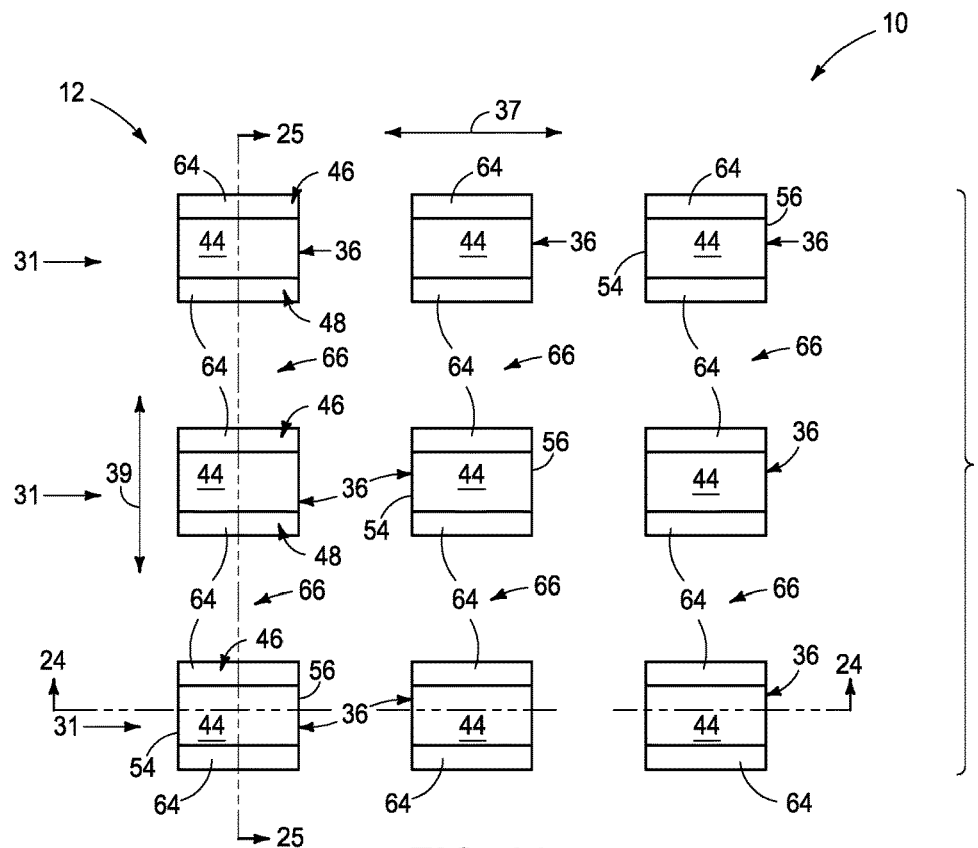
Figure 24:
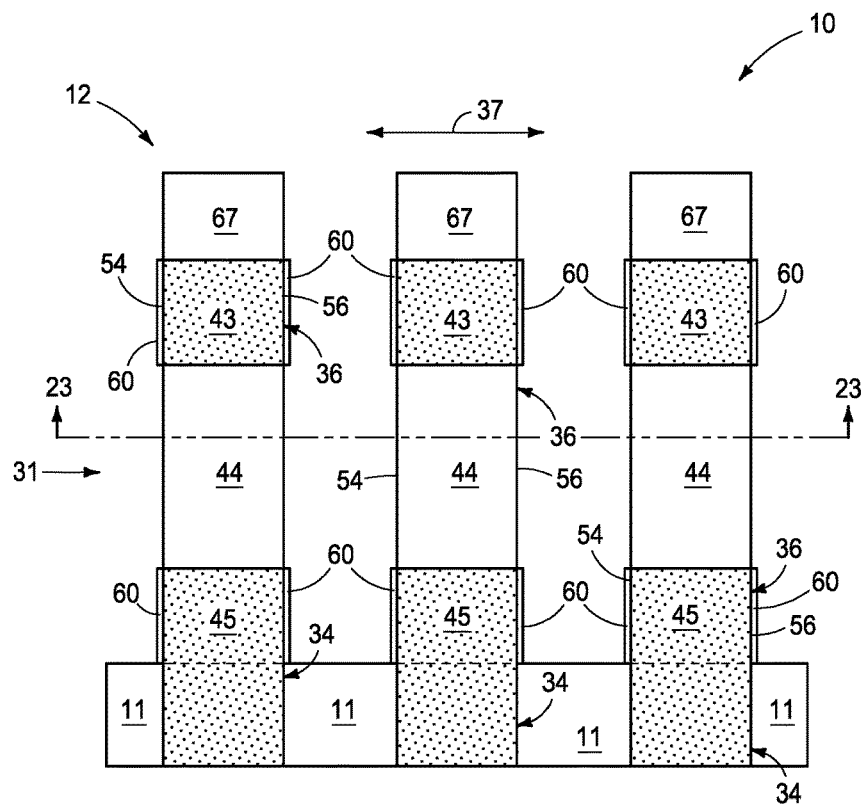
Figure 25:
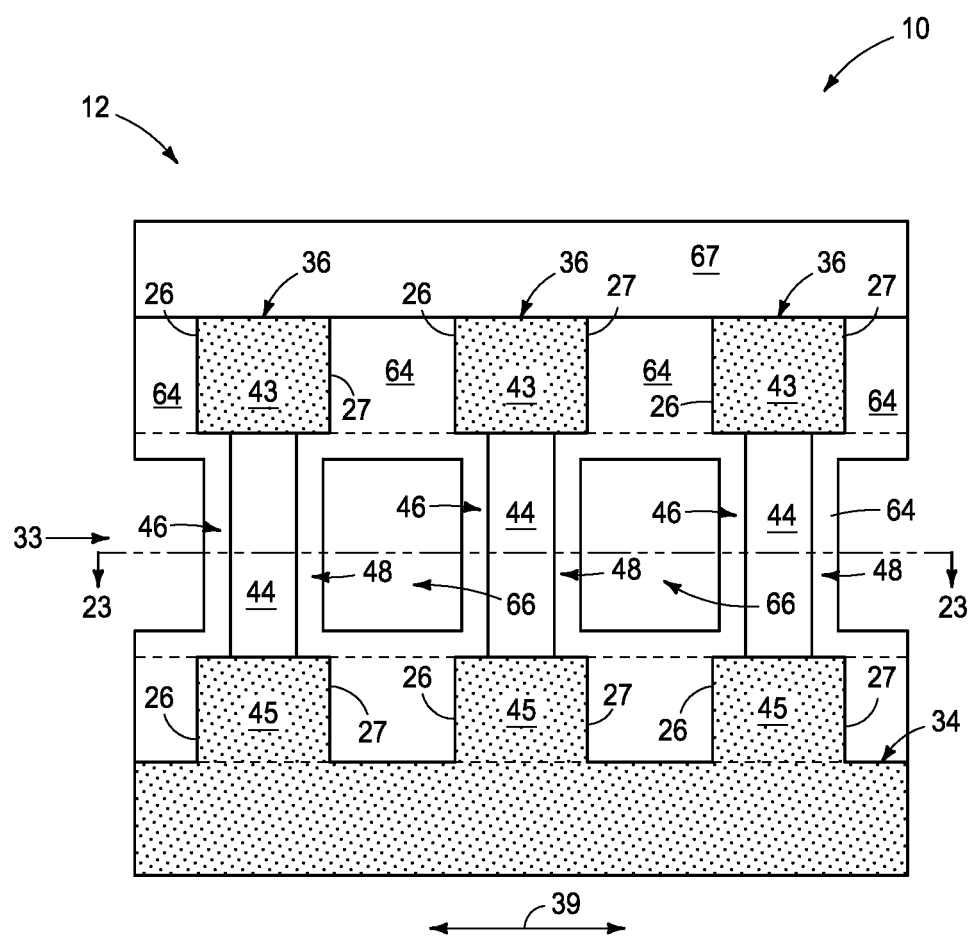
Figure 26:
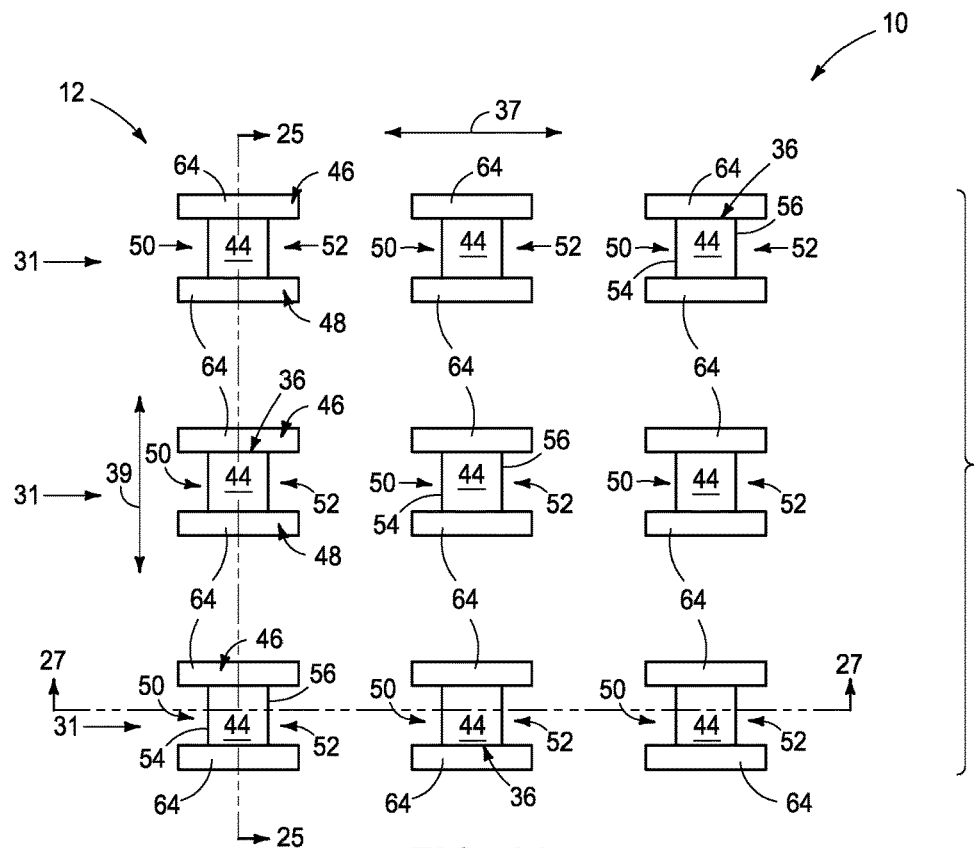
Figure 27:
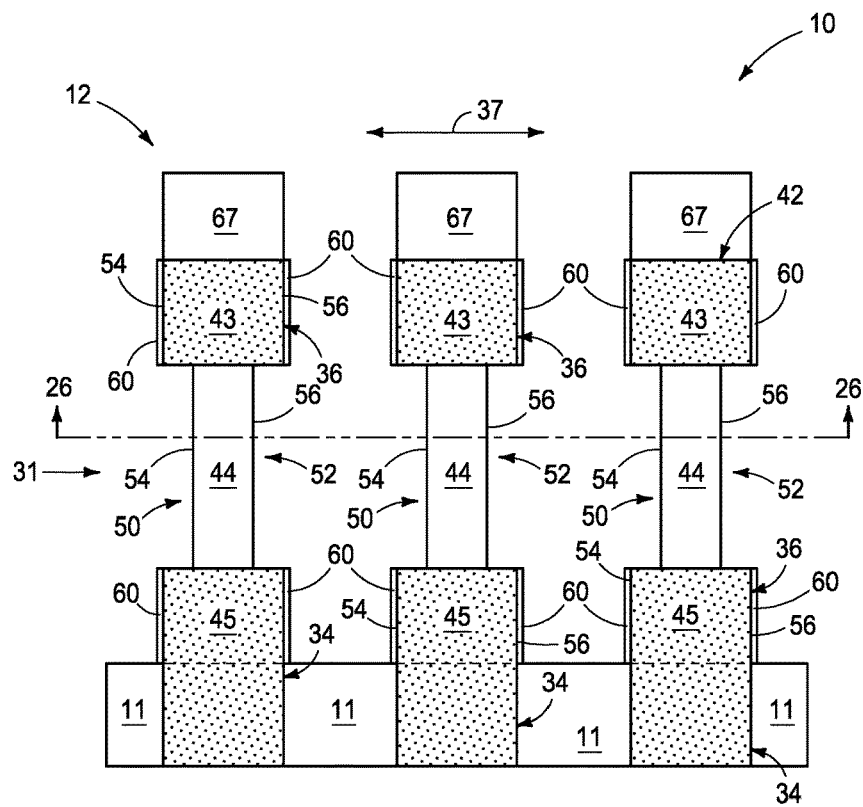
Figure 28:
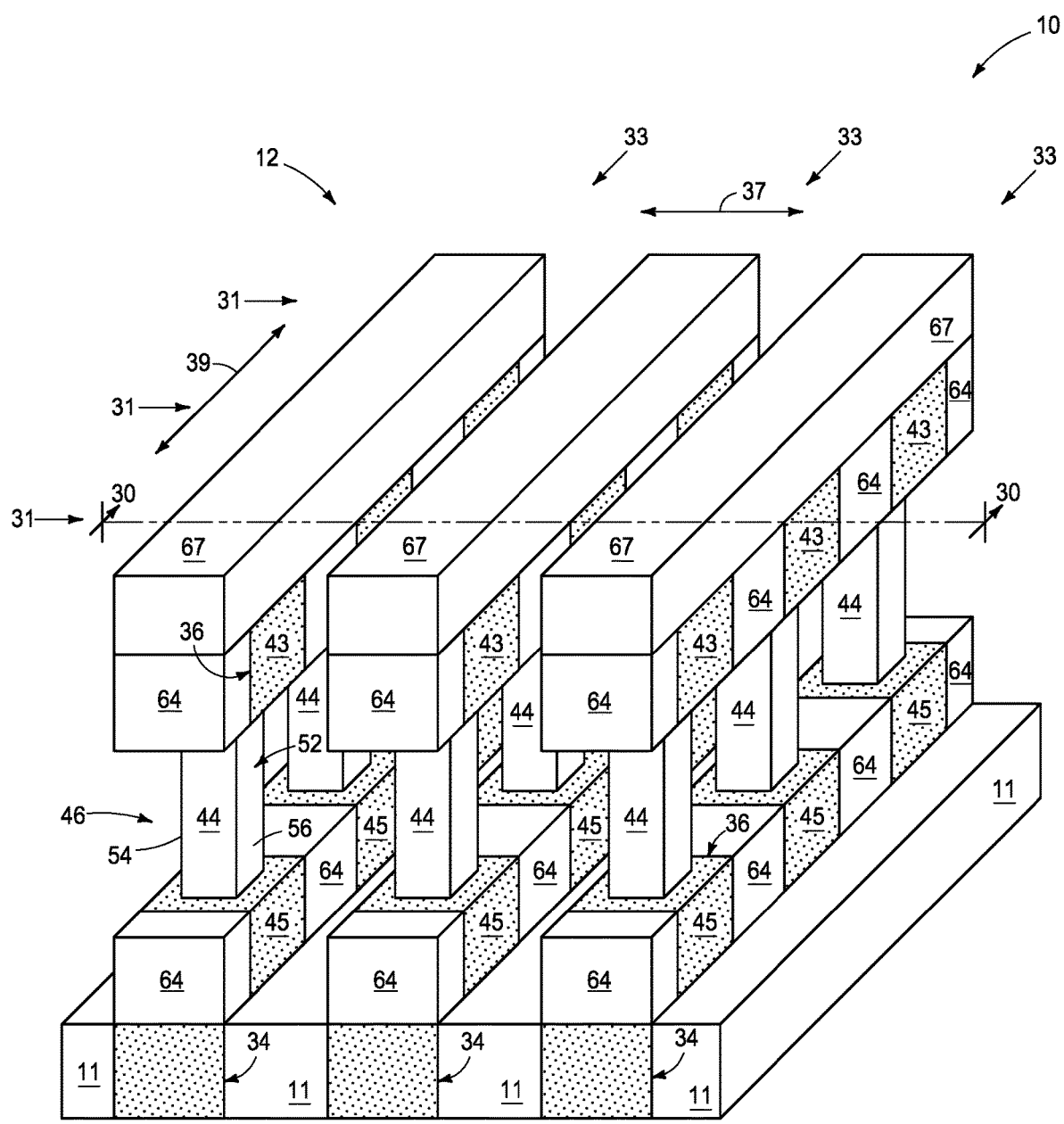
Figure 29:
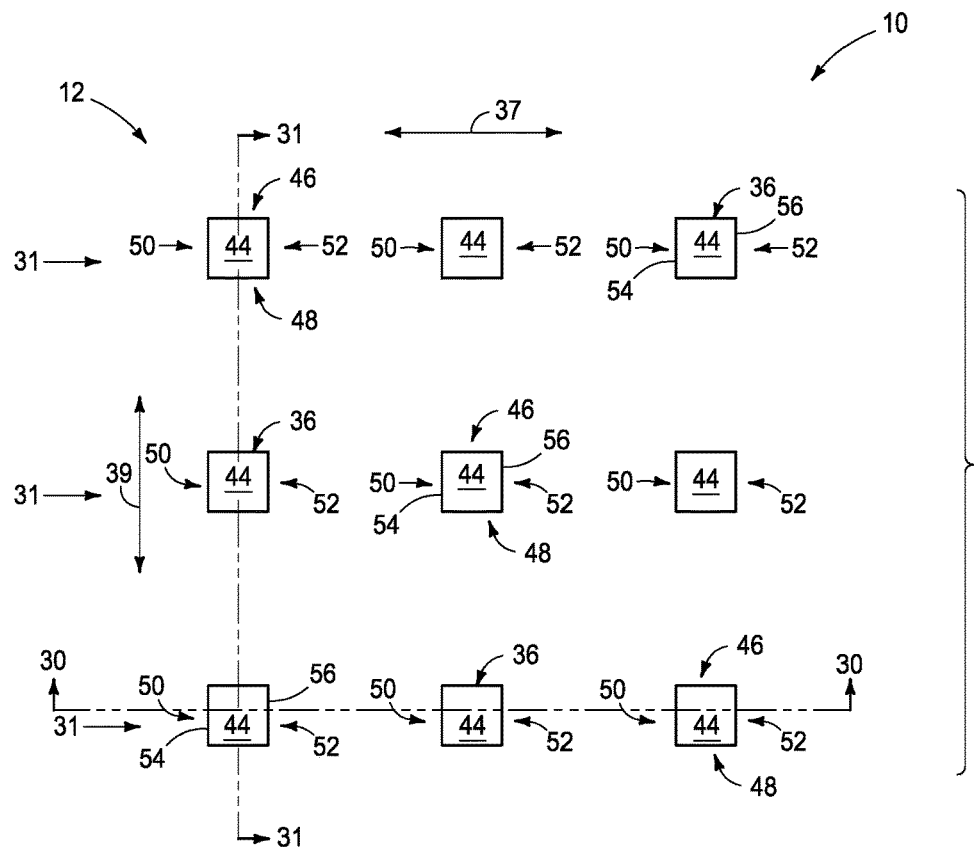
Figure 30:
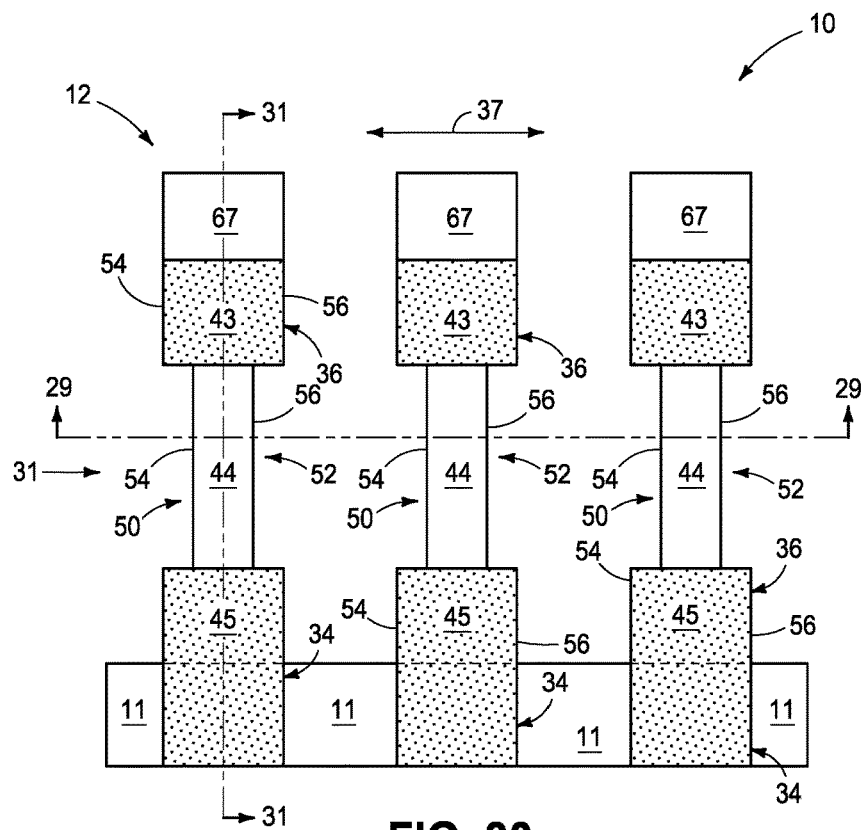
Figure 31:
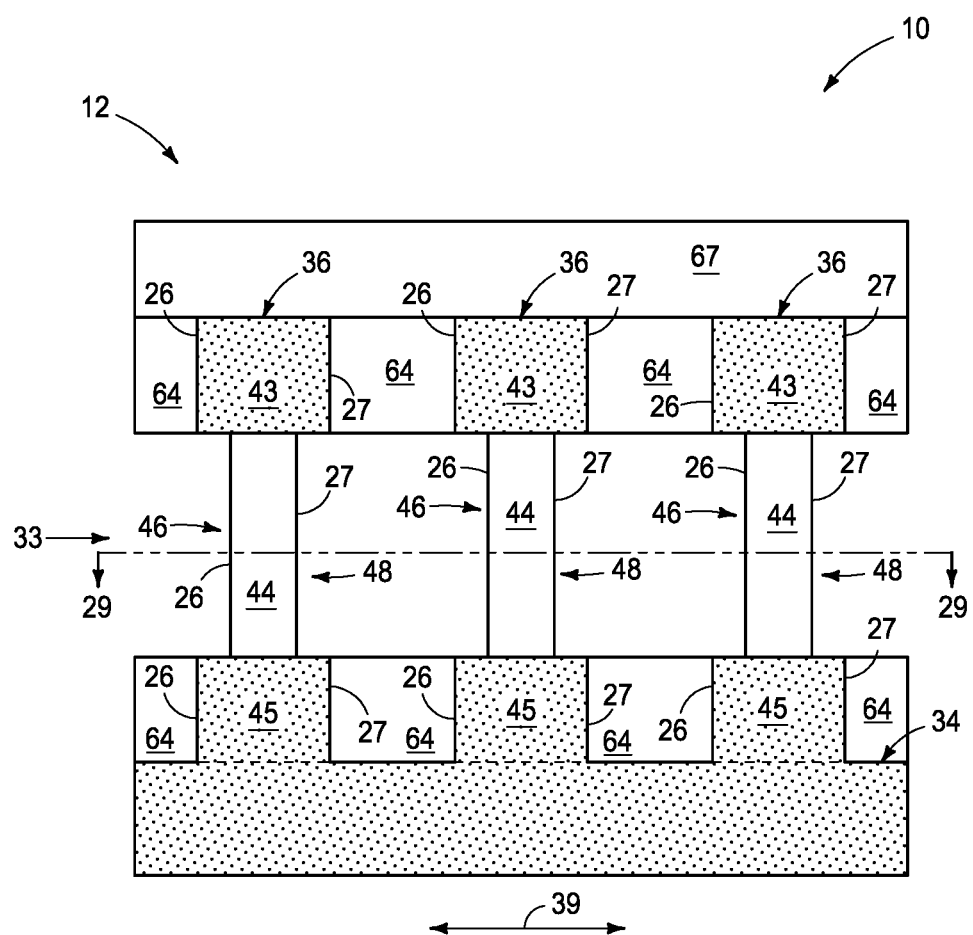

FIGS. 21-31 show example repeating of the processing described above with respect to FIGS. 8-15. Specifically, FIGS. 21 and 22 show formation of sacrificial masking material 60 with respect to second opposing sides 54, 56 of channel-region material 44 analogous to that shown by FIGS. 8 and 9. FIGS. 23-25 show sacrificial masking material 60 as having been removed from being over second opposing sides 54, 56 of channel-region material 44 to leave sacrificial masking material 60 over opposing sides 54, 56 of top and bottom source/drain-region materials 43, 45 analogous to that shown by FIGS. 10 and 11. Void-spaces 66 in sacrificial material 64 may be enlarged thereby as shown. FIGS. 26 and 27 show channel-region material 44 as having been etched selectively relative to sacrificial masking material 60 that is over opposing sides 54, 56 of top and bottom source/drain-region materials 43, 45 to form a pair (in some embodiments referred to as a second pair) of lateral recesses 50, 52 analogous to that shown by FIGS. 12-15. FIGS. 28-31 show sacrificial masking material 64 as having been removed (e.g., by isotropic etching) from being over opposing sides 54, 56 of channel-region material 44.

Such is but one example embodiment of, and may be considered as, laterally recessing channel-region material 44 of pillars 36 in first direction 37 relative to top and bottom source/drain-region materials 43, 45 to form a second pair of lateral recesses 50, 52 in second opposing sides 54, 56 of channel-region material 44 in individual pillars 36.

Figure 32:
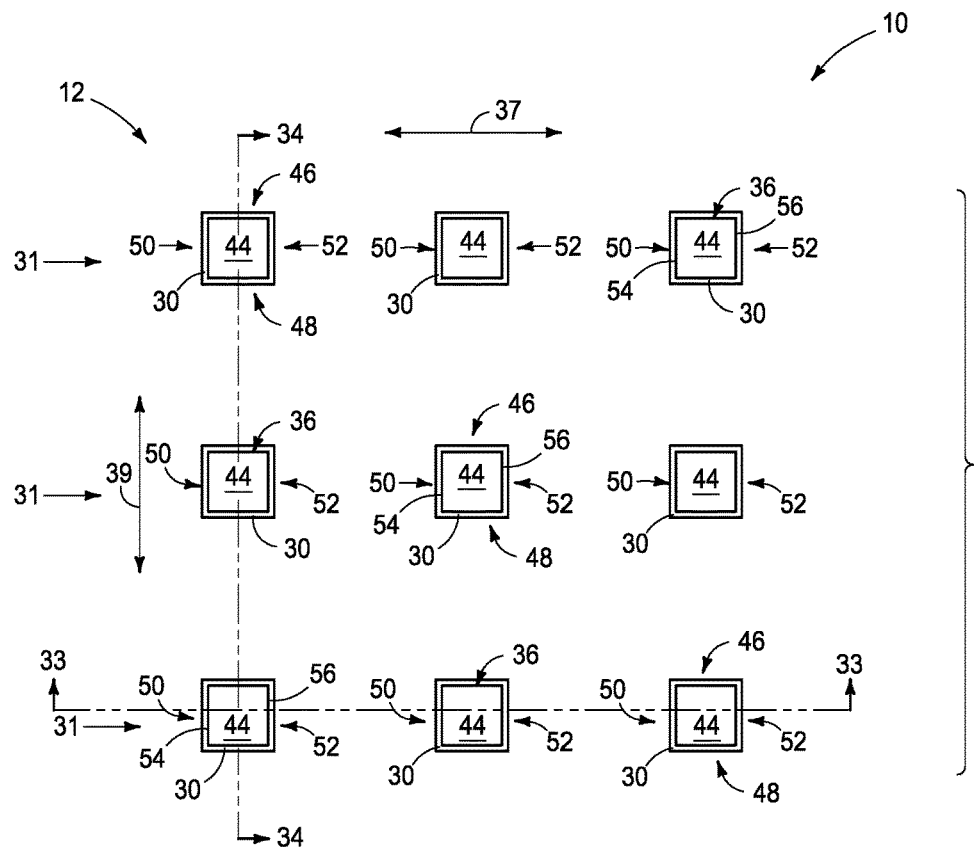
Figure 33:
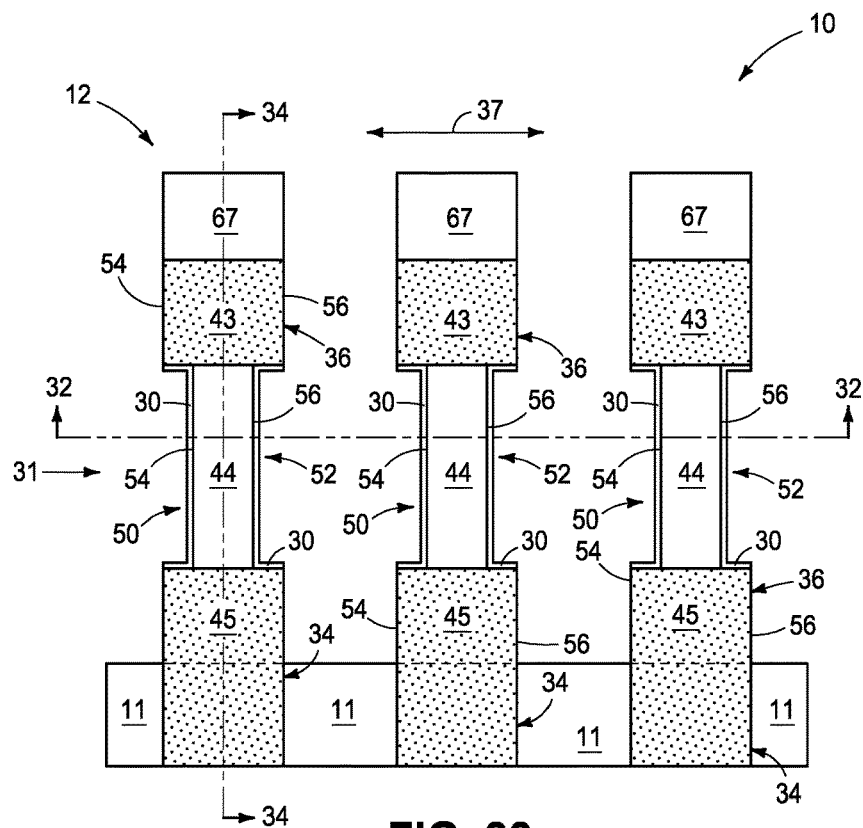
Figure 34:
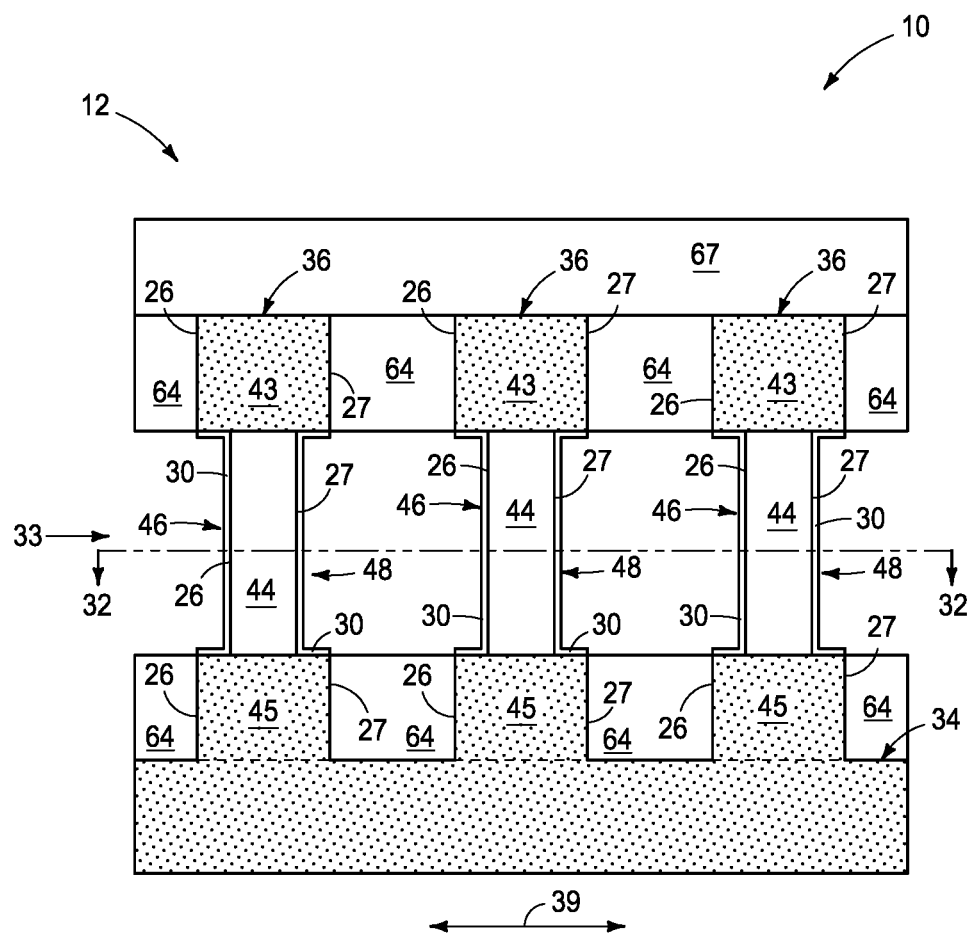

Referring to FIGS. 32-34, a gate insulator 30 has been formed in lateral recesses 46, 48, 50, 52 over respective opposing sides 26, 27 and 54, 56 of channel-region material 44. In one embodiment, bottom portions of top-source/drain-region material 43 and top portions of bottom-source/drain-region material 45 also have gate insulator 30 formed there-over. Such would also be formed over sidewalls (not shown) of materials 43, 45, and 67 and may be removed there-from (as shown) or remain over such sidewalls (not shown).

Figure 35:
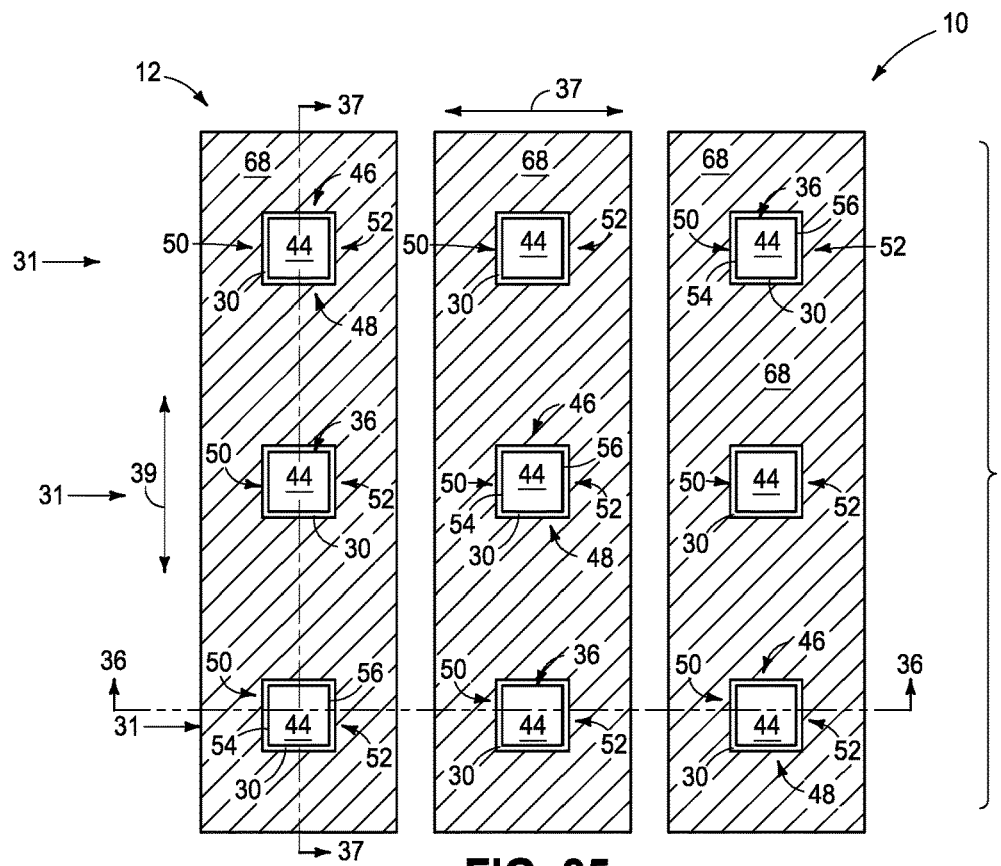
Figure 36:
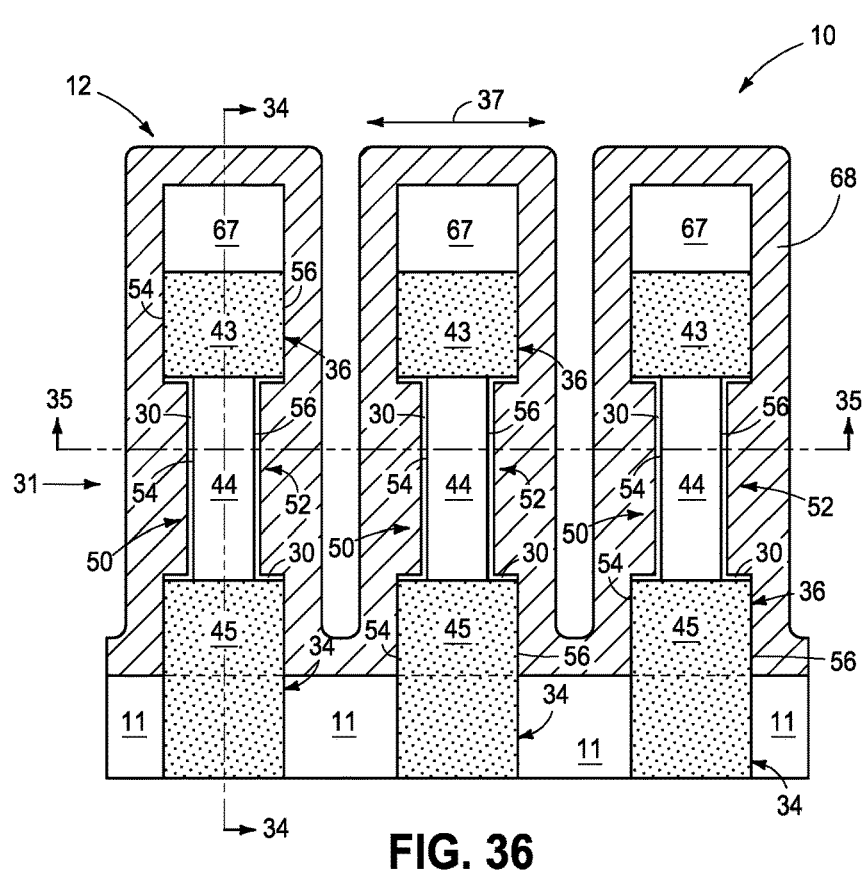
Figure 37:
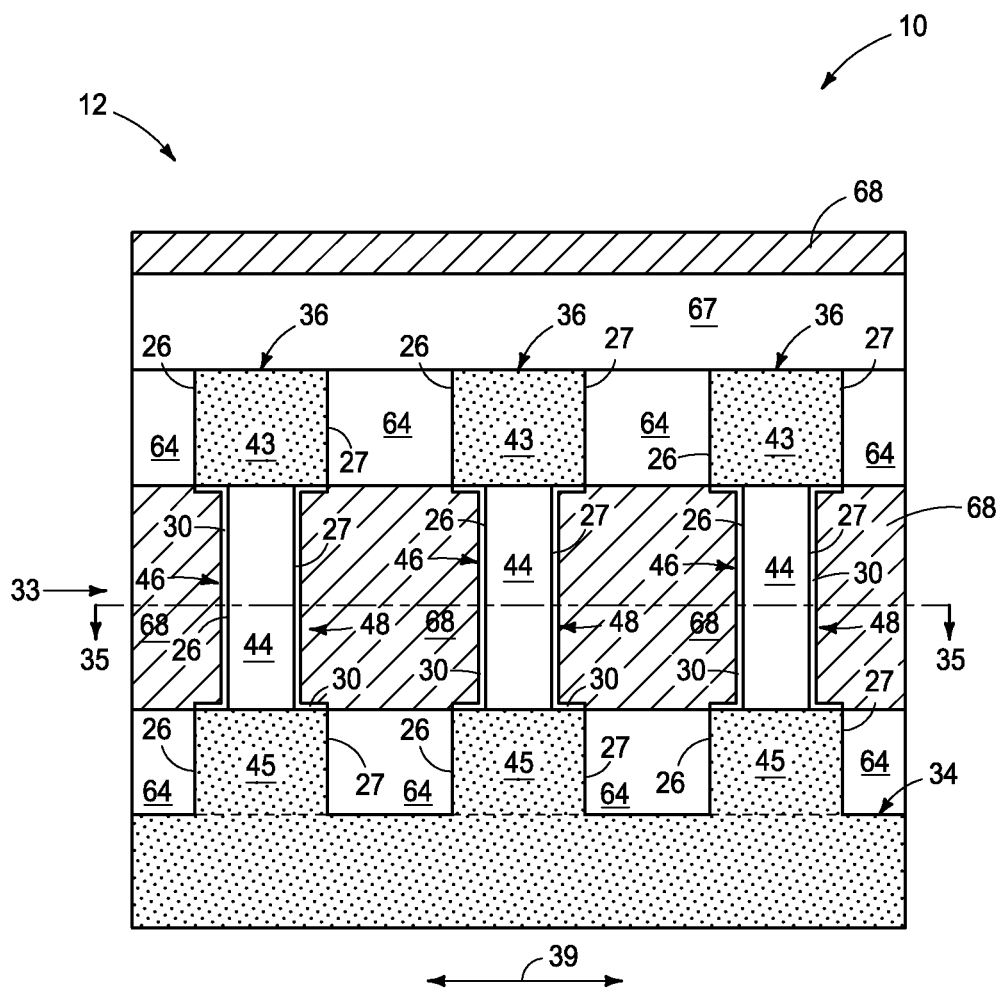
Figure 38:
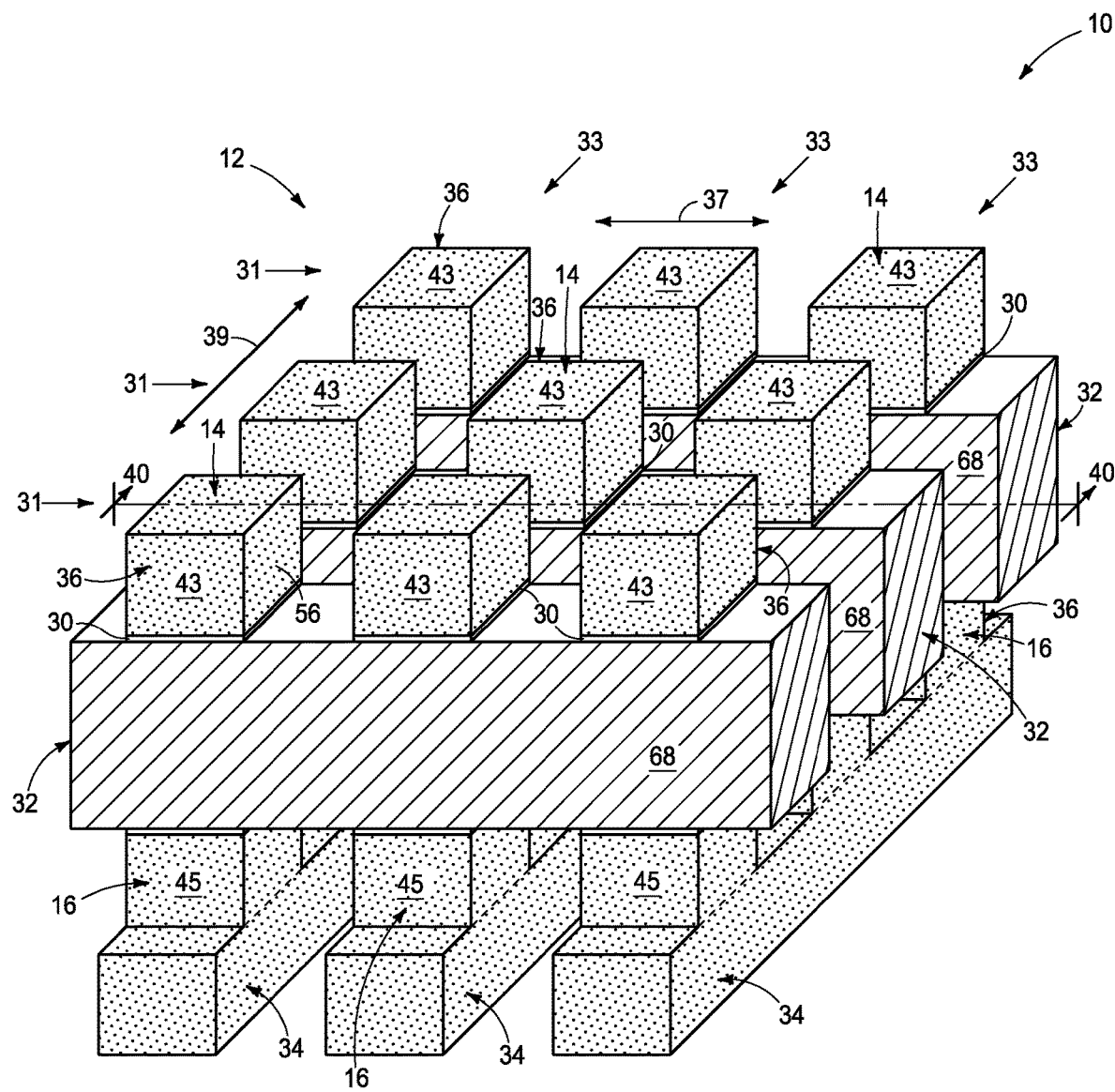
Figure 39:
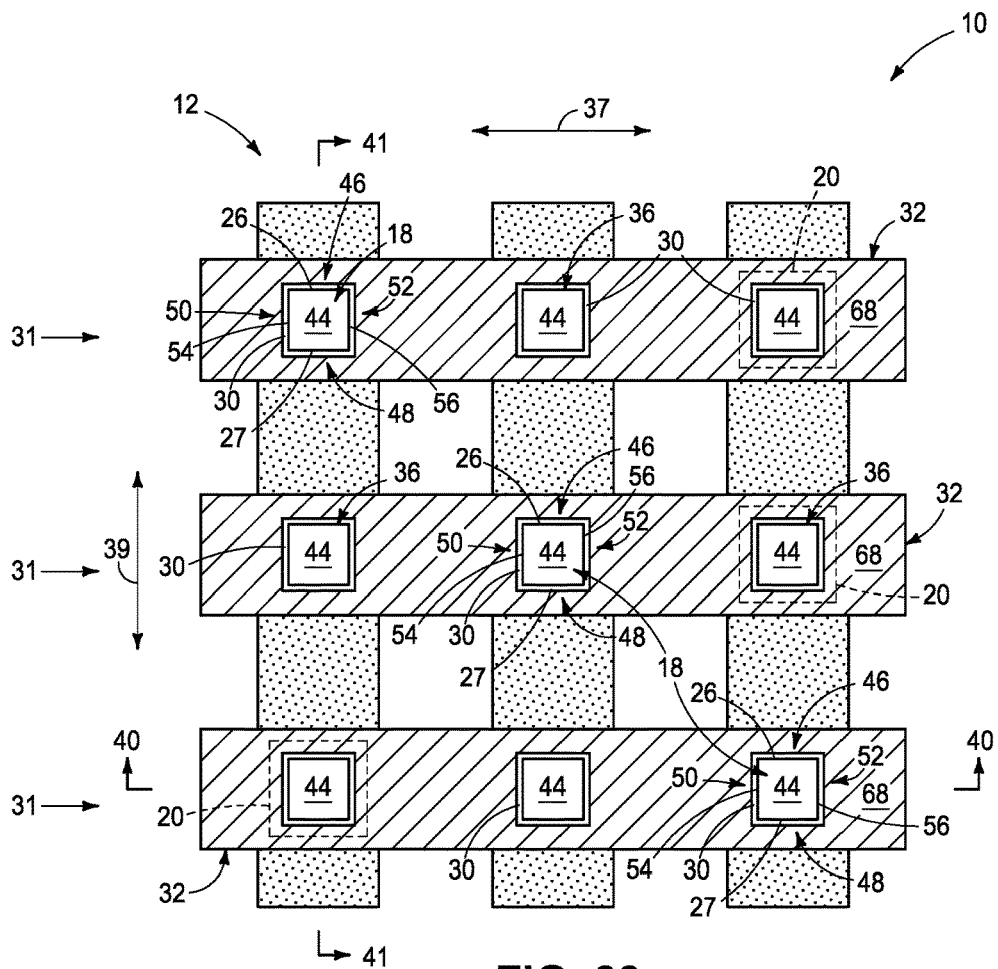
Figure 40:
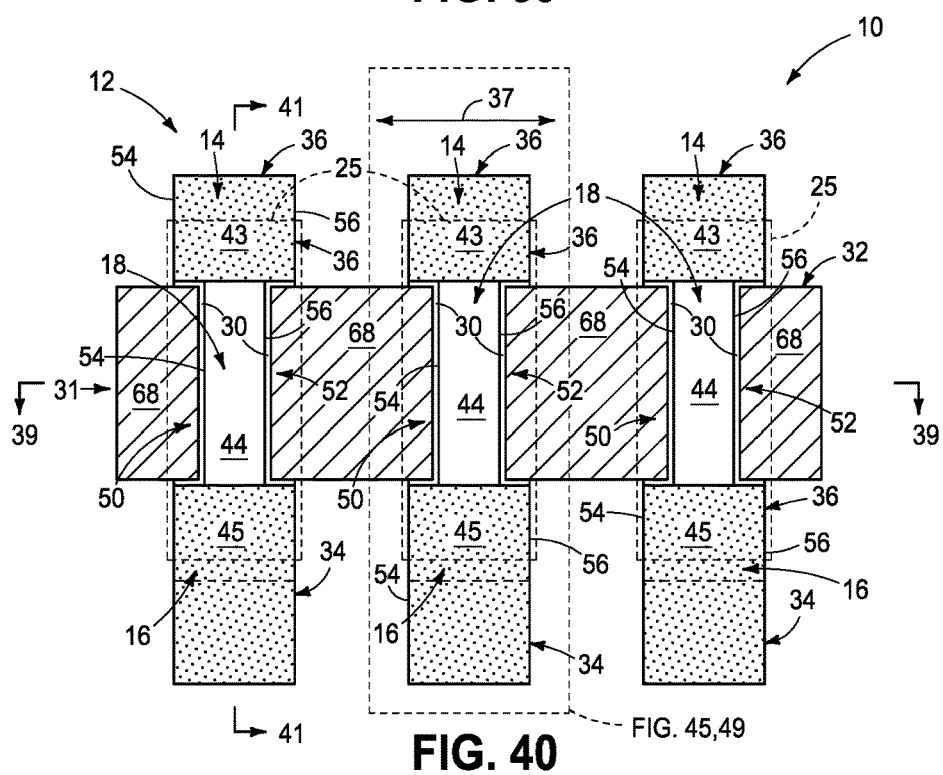
Figure 41:
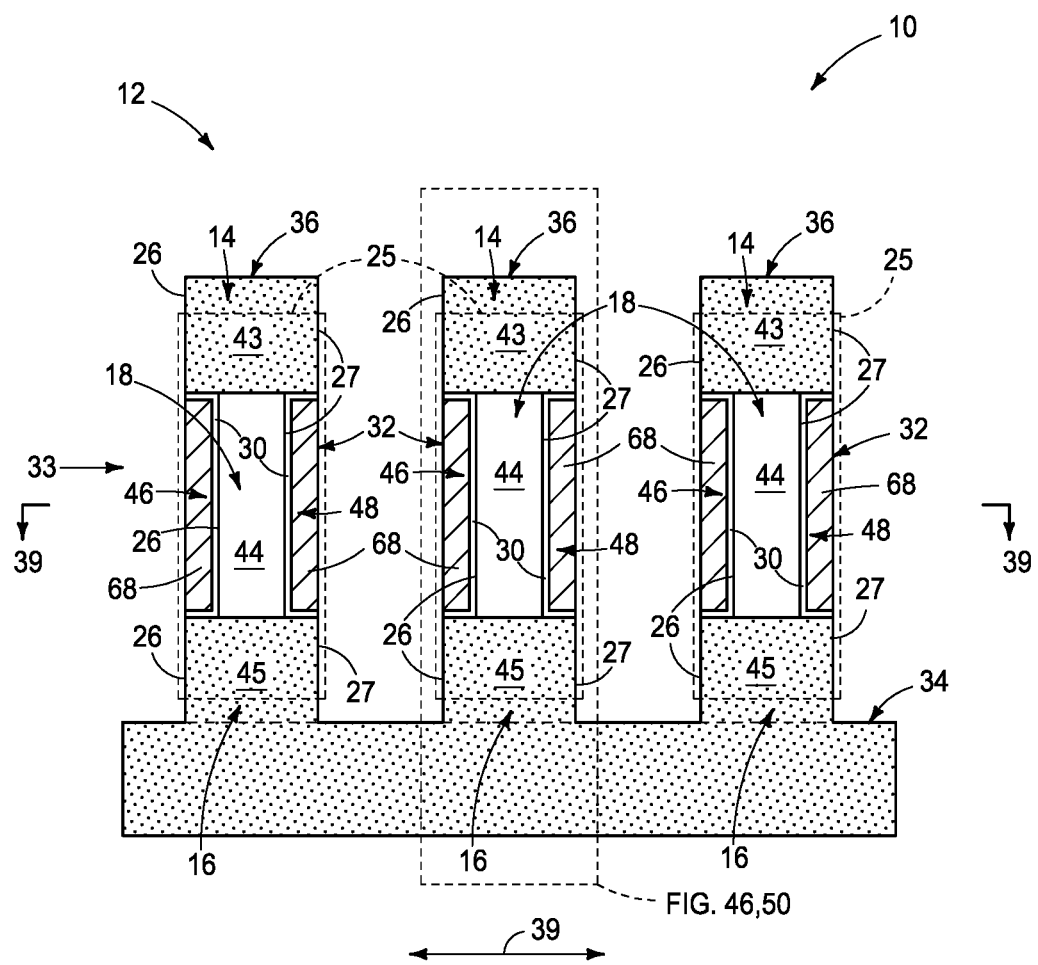

Referring to FIGS. 35-37, conductive material 68 for gates has been deposited.

FIGS. 38-41 and 45-48 show forming individual rows 31 of gatelines 32 (e.g., wordlines) in first direction 37 above digitlines 34. Transistors 25 (FIGS. 40, 41, 45, and 46) are formed thereby that individually comprise a top source/drain region 14, a bottom source/drain region 16, a channel region 18 vertically between the top and bottom source/drain regions, and a gate 20 (FIGS. 39 and 47) operatively-aside channel region 18, with gate 20 comprising part of a gateline 32 that interconnects a plurality of transistors 25 in a row 31. In one embodiment and as shown, gatelines 32 individually operatively completely encircle channel-region material 44 of individual pillars 36 in first pair of lateral recesses 46, 48 and in second pairs of lateral recesses 50, 52. In one embodiment and as shown, the two opposing sides 26 and 27 are vertically aligned with two opposing sides of gate 20 (e.g., in the cross-sections of FIGS. 41 and 44.

Figure 42:
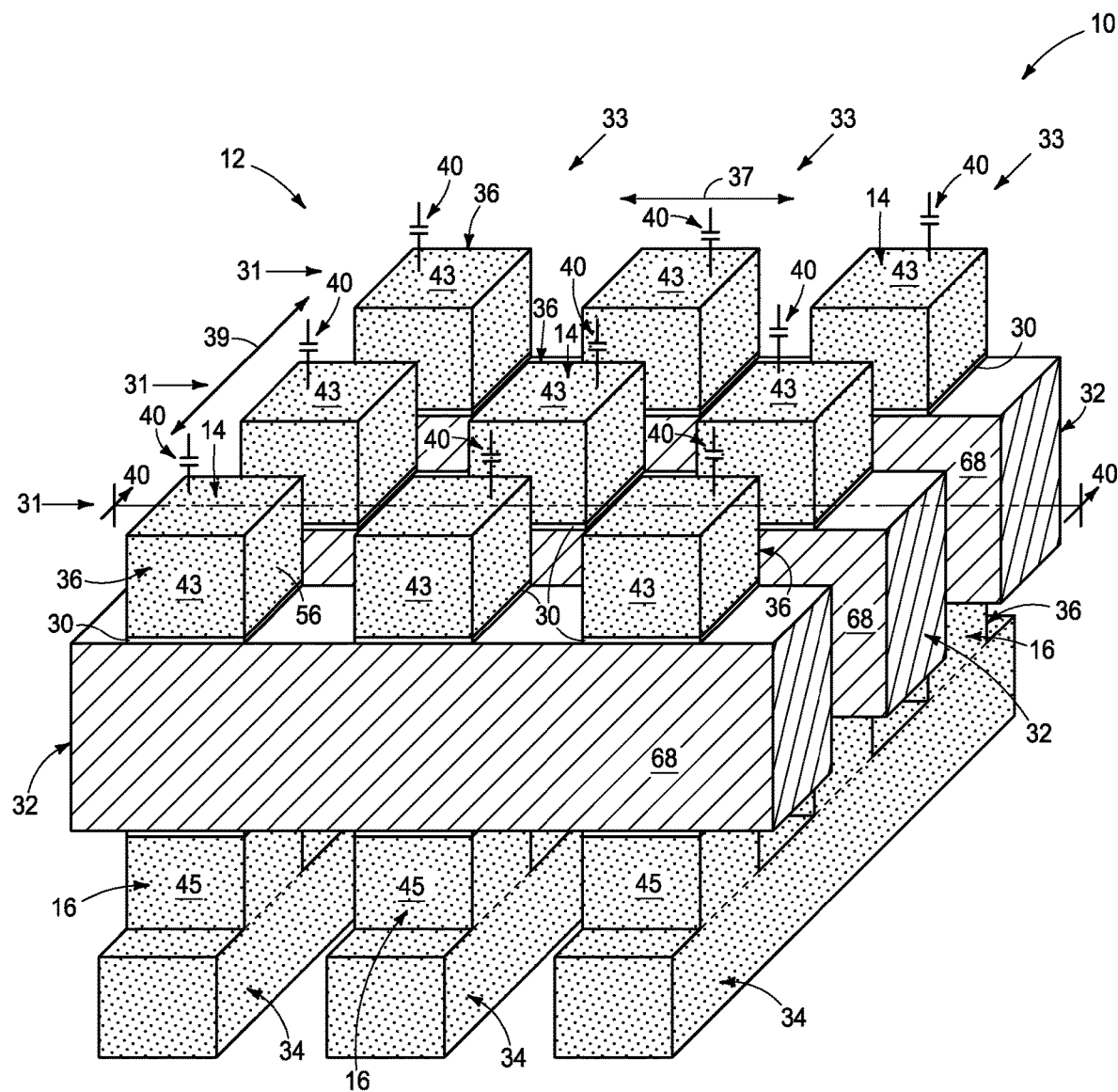
Figure 43:
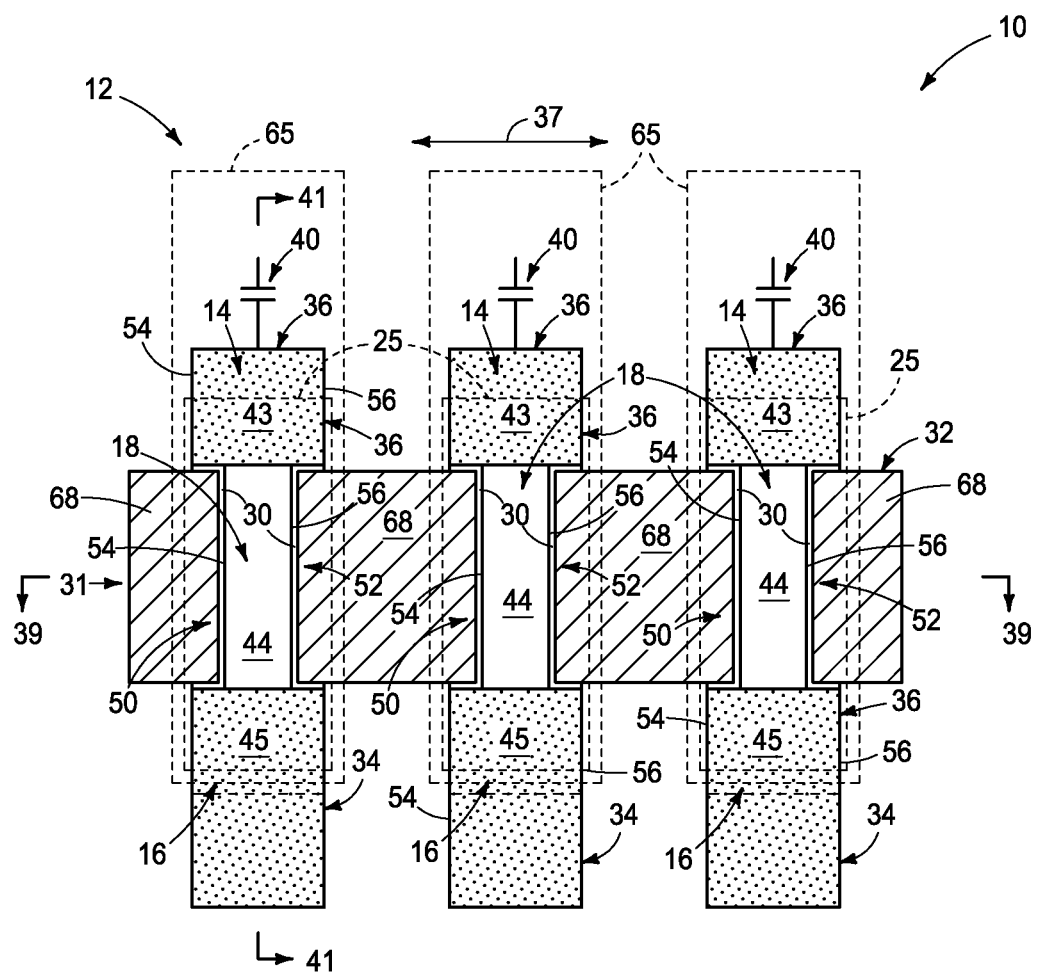
Figure 44:
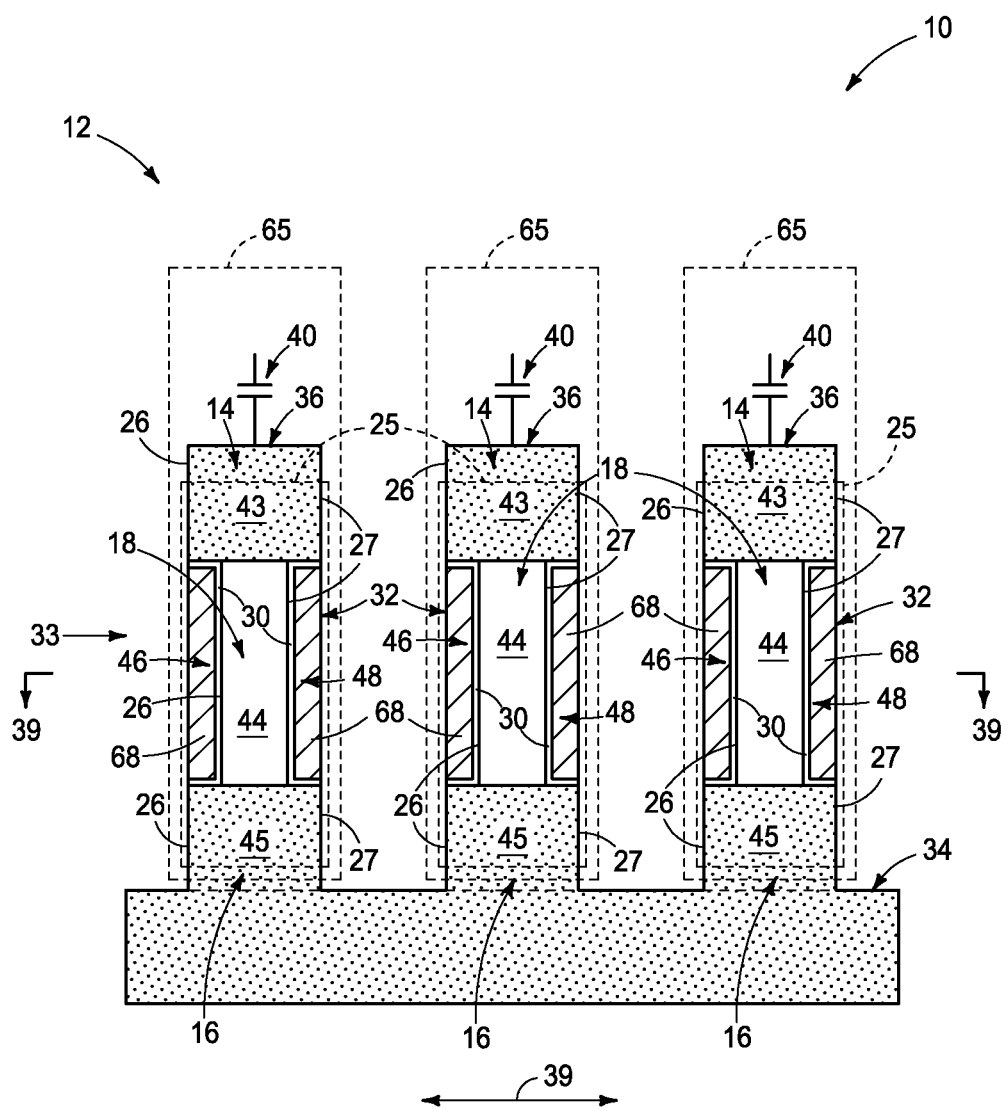
Figure 45:
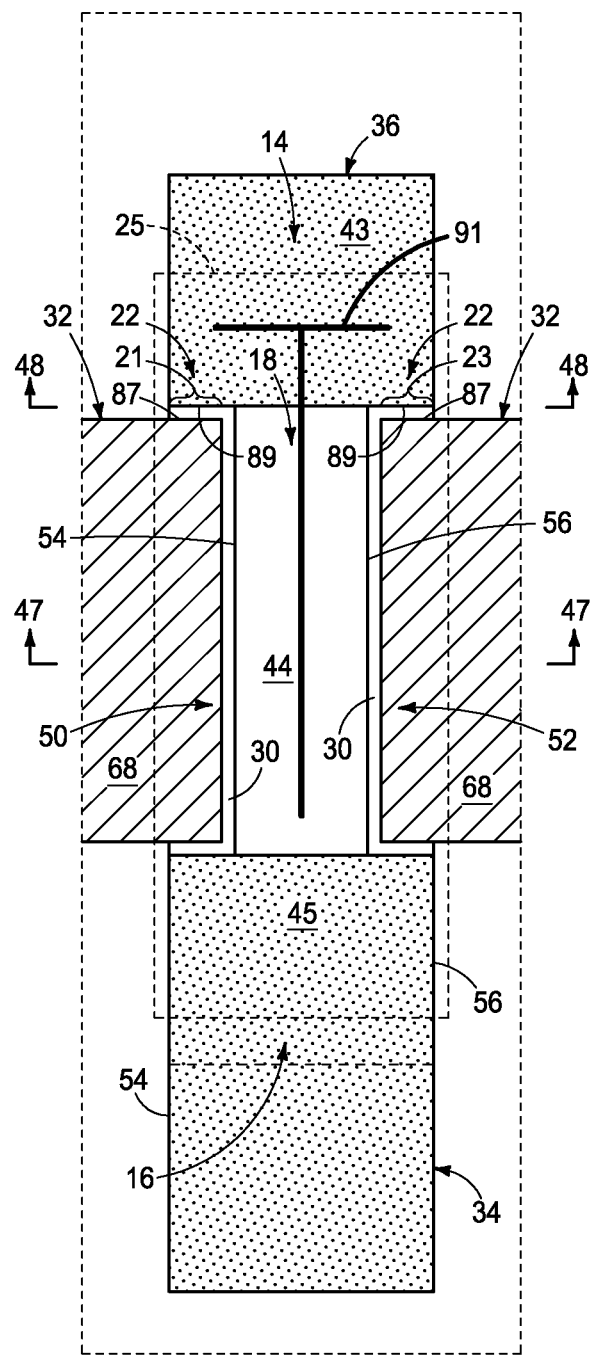
Figure 46:
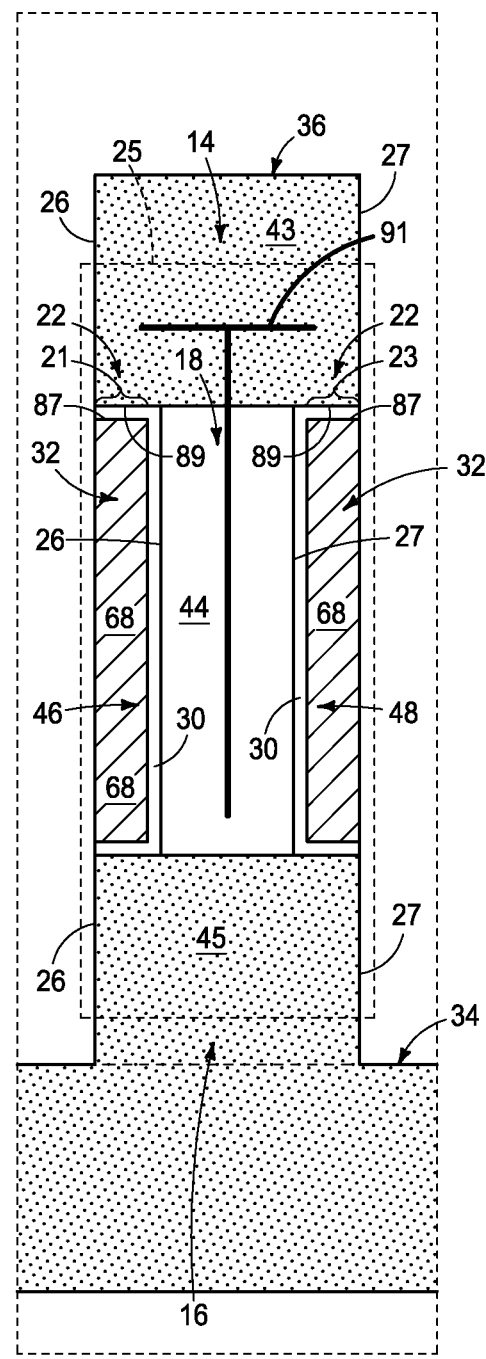
Figure 49:
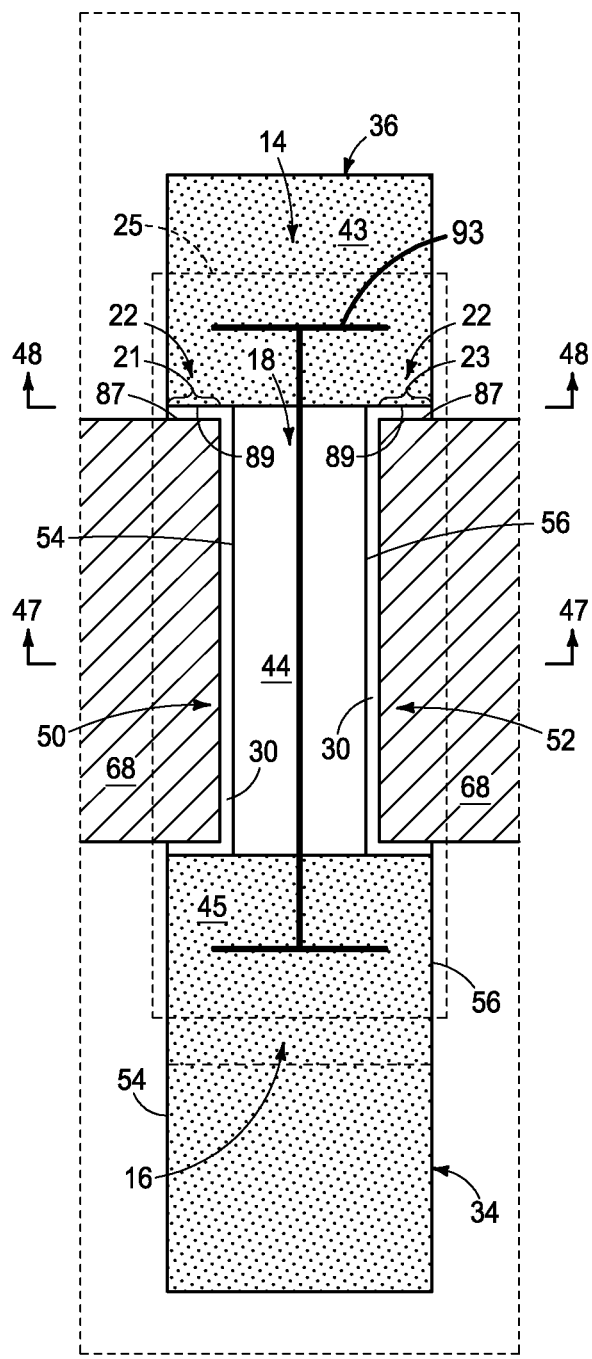
Figure 50:
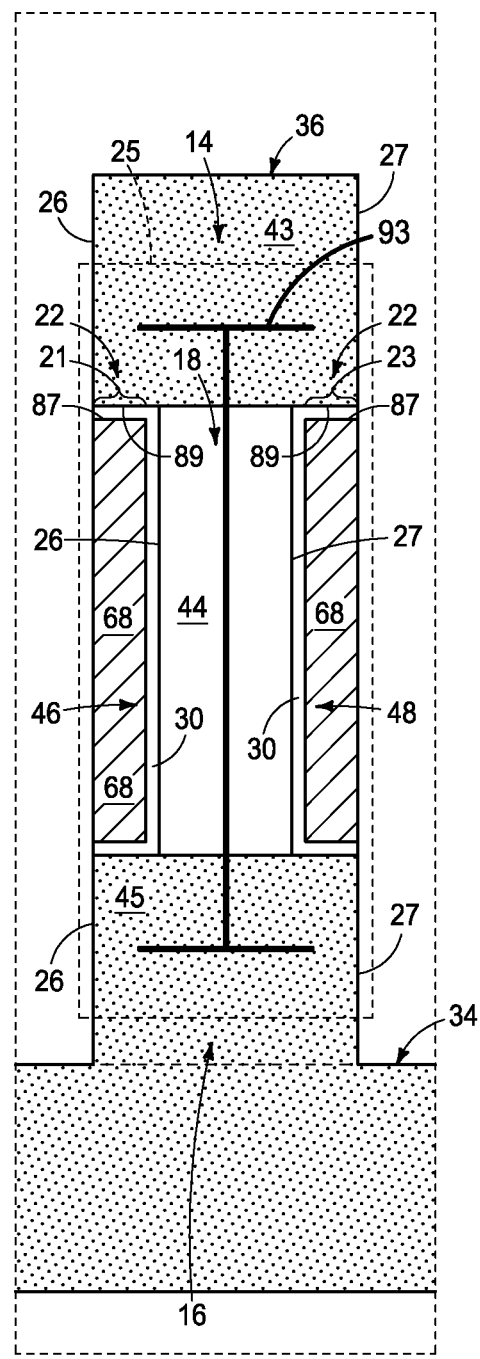

In some embodiments, and referring to FIGS. 42-44, a programmable storage device 40 (e.g., a volatile or non-volatile capacitor shown schematically) is electrically coupled with individual top-source/drain-region material 43, for example forming a memory cell 65 that individually comprises a transistor 25 and storage device 40. By way of example only, such may comprise dynamic random access memory (DRAM) circuitry. Alternately or additionally, and by way of example only, a programmable storage device may be formed as part of the transistor, for example by provision of a programmable material between the gate and gate insulator separated by insulating material or regions on both sides of the programmable material.

Any other attribute(s) or aspect(s) as shown and/or described herein with respect to other embodiments may be used in the embodiments shown and described with reference to the above embodiments.

An embodiment of the invention comprises a method used in forming an array (e.g., 12) of memory cells (e.g., 65) individually comprising a transistor (e.g., 25). The array comprises rows (e.g., 31) of gatelines (e.g., 32) and columns (e.g., 33) of digitlines (e.g., 34). Lines (e.g., 42) of top-source/drain-region material (e.g., 43), bottom-source/drain-region material (e.g., 45) and channel-region material (e.g., 44) vertically there-between are formed in rows (e.g., 31) in a first direction (e.g., 37) for formation of transistors. The lines are spaced from one another in a second direction (e.g., 39). The top-source/drain-region material, bottom-source/drain-region material, and channel-region material have respective opposing sides (e.g., 26, 27). The channel-region material is laterally recessed in the second direction relative to the top-source/drain-region material and the bottom-source/drain-region material to form a pair of lateral recesses (e.g., 46, 48) on the opposing sides of the channel-region material in the individual rows. Thereafter, the lines of the top-source/drain-region material, channel-region material, and bottom-source/drain-region material are patterned in the second direction to comprise pillars (e.g., 36) of individual transistors being formed. Individual rows (e.g., 31) of gatelines (e.g., 32) are formed in the first direction and that individually are operatively aside the channel-region material (regardless of whether wrapping circumferentially there-around) of individual of the pillars in the pairs of lateral recesses and that interconnect the transistors in that individual row (e.g., 31). Any other attribute(s) or aspect(s) as shown and/or described herein with respect to other embodiments may be used.

In one embodiment, a method is associated with forming an array (e.g., 12) of transistors (e.g., 25) individually comprising a top source/drain region (e.g., 14), a bottom source/drain region (e.g., 16), a channel region (e.g., 18) vertically between the top and bottom source/drain regions, and a gate (e.g., 20) operatively-aside the channel region, with the gate comprising part of a gateline (e.g., 32) that interconnects a plurality of the transistors in a row (e.g., 31). The method comprises laterally recessing laterally-spaced rows (e.g., 31) of channel-region material (e.g., 44) relative to top-source/drain-region material (e.g., 43) and bottom-source/drain-region material (e.g., 45) to form a pair of lateral recesses (e.g., 46, 48) on opposing sides (e.g., 26, 27) of the channel-region material in a vertical cross-section (e.g., that of FIG. 15) in individual of the rows of channel-region material. The pair of recesses is longitudinally elongated in a row direction (e.g., 37). Gatelines (e.g., 32) are formed in a vertically and laterally self-aligning manner in the lateral recesses operatively-adjacent the channel-region material. In this document, a "vertically self-aligning manner" means a technique whereby position and elevational extents of some or all of an elevationally-extending feature (e.g., a gateline) is formed by previously-defined top and bottom termini of an elevationally-extending sidewall or a portion thereof of said feature, thereby not requiring subsequent processing with respect to those top and bottom termini. In this document, a "laterally self-aligning manner" means a technique whereby at least one pair of opposing edges of a structure is formed by a pair of previously-defined edges, thereby not requiring subsequent photolithographic processing with respect to those opposing edges. In this document, a "circumferentially self-aligning manner" is a laterally self-aligning technique whereby all lateral surfaces of a structure are defined by deposition of material against an encircling sidewall of a previously patterned structure.

In one such embodiment, the top source/drain-region material and the channel-region material are patterned to comprise pillars (e.g., 36) that individually comprise a top source/drain region (e.g., 14) and a channel region (e.g., 18) of individual of the transistors. In one embodiment, the patterning is conducted before forming the gatelines and in one embodiment individual of the pillars are circumferentially surrounded by one of the gatelines and the vertically and laterally self-aligning manner is a circumferentially self-aligning manner circumferentially about the individual pillars.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a transistor (e.g., 25) comprises a top source/drain region (e.g., 14), a bottom source/drain region (e.g., 16), a channel region (e.g., 18) vertically between the top and bottom source/drain regions, and a gate (e.g., 20) operatively-aside the channel region. The top source/drain region has a portion (e.g., 22 in FIGS. 45, 46, 48-50) thereof that is directly above the gate in a vertical cross-section (e.g., that of either of FIG. 45 or 46). In one embodiment, such portion is a first portion (e.g., 21), the gate is on two opposing sides (e.g., 26, 27 or 54, 56) of the channel region, the first portion is directly above the gate on one of the two opposing sides (e.g., 26 or 54), with the top source/drain region having a second portion (e.g., 23) thereof that is directly above the gate on the other of the two opposing sides (e.g., 27 or 56). In one embodiment, the gate completely encircles the channel region in a first horizontal cross-section (e.g., that of FIGS. 39 and 47). The portion (e.g., 22) comprises an annulus (e.g., square ring 28 in FIG. 48) completely encircling the channel region in a second horizontal cross-section (e.g., that part of top source/drain region material 43 that encircles channel-region material 44 radially outside of gate insulator 30 as exemplified by FIG. 48) that is above the first horizontal cross-section. In one embodiment, the transistor comprises a gate insulator (e.g., 30) between the channel region and the gate, with the gate insulator extending to be vertically between a top (e.g., 87) of the gate, and a bottom (e.g., 89) of the portion of the top source/drain region that is directly above the gate in the vertical cross-section. Any other attribute(s) or aspect(s) as shown and/or described herein with respect to other embodiments may be used.

In one embodiment, a transistor (e.g., 25) comprises a top source/drain region (e.g., 14), a bottom source/drain region (e.g., 16), a channel region (e.g., 18) vertically between the top and bottom source/drain regions, and a gate (e.g., 20) operatively-aside the channel region. The top source/drain region and the channel region collectively in a vertical cross-section (e.g., either that of FIG. 45 or 46) are "T" in shape (i.e., such have the vertical cross-sectional shape of a capital "T" 91 at least in sans-serif letterform regardless of length of the horizontal portion that crosses the vertical portion). In one such embodiment, the vertical cross-section is a first vertical cross-section (e.g., one of FIG. 45 or 46) and the top source/drain region and channel region collectively in a second vertical cross-section (e.g., the other of FIG. 45 or 46) that is orthogonal the first vertical cross-section are "T" in shape. In one embodiment, the top source/drain region, the channel region, and the bottom source/drain region collectively in the vertical cross-section (e.g., either that of FIG. 49 or 50) are I-beam in shape (i.e., such have the vertical cross-sectional shape of a capital "I" 93 at least in sans-serif letterform regardless of length of the horizontal portions that cross the vertical portion). In one such embodiment, the vertical cross-section is a first vertical cross-section (e.g., one of FIG. 49 or 50) and the top source/drain region, the channel region, and the bottom source/drain region collectively in a second vertical cross-section (e.g., the other of FIG. 49 or 50) that is orthogonal the first cross-section are I-beam in shape. As shown, a "T shape may be considered as part of an "I" shape. Any other attribute(s) or aspect(s) as shown and/or described herein with respect to other embodiments may be used Embodiments of the invention comprise an array (e.g., 12) of memory cells (e.g., 65) individually comprising a transistor (e.g., 25), with the array comprising rows (e.g., 31) of gatelines (e.g., 32) and columns (e.g., 33) of digitlines (e.g., 34). The array comprises pillars (e.g., 36) spaced relative one another in a first direction (e.g., 37) and in a second direction (e.g., 39). The pillars individually comprise a top source/drain region (e.g., 14) and a channel region (e.g., 18) there-below of individual of the transistors. A bottom source/drain region (e.g., 16) of the individual transistors is below the channel region (regardless of whether the bottom source/drain region is part of a pillar 36 or whether the bottom source/drain region is merely part of a digitline in the absence of a portion of the pillar being below the channel region [not shown]). Individual of columns comprise a digitline (e.g., 34) electrically coupled to multiple of the bottom source/drain regions of the individual transistors and which interconnect the transistors in that individual column. Individual of the rows comprise a gateline (e.g., 32) crossing above the digitlines. The gateline crosses operatively-aside multiple of the channel regions of the pillars and interconnects the transistors in that individual row. In one embodiment, the top source/drain regions individually have a portion (e.g., 22) thereof that is directly above its crossing gateline there-below. In one embodiment, the top source/drain region and channel region collectively in a vertical cross-section (e.g., FIG. 45 or 46) are "T" in shape. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming an array of memory cells individually comprising a transistor, with the array comprising rows of gatelines and columns of digitlines, comprises forming lines of top-source/drain-region material, bottom-source/drain-region material, and channel-region material vertically there-between in rows in a first direction for formation of transistors. The lines are spaced from one another in a second direction. The top-source/drain-region material, bottom-source/drain-region material, and channel-region material have respective opposing sides. The channel-region material on its opposing sides is laterally recessed in the second direction relative to the top-source/drain-region material and the bottom-source/drain-region material on their opposing sides to form a pair of lateral recesses in the opposing sides of the channel-region material in individual of the rows. After the pair of lateral recesses are formed, the lines of the top-source/drain-region material, the channel-region material, and the bottom-source/drain-region material are patterned in the second direction to comprise pillars of individual transistors. Individual rows of gatelines are formed in the first direction that individually are operatively aside the channel-region material of individual of the pillars in the pairs of lateral recesses and that interconnect the transistors in that individual row.

In some embodiments, a method used in forming an array of memory cells individually comprising a transistor comprises forming columns of digitlines in a second direction. Lines of top-source/drain-region material, bottom-source/drain-region material, and channel-region material are formed vertically there-between in rows in a first direction for formation of transistors. The lines are spaced from one another in the second direction. The top-source/drain-region material, bottom-source/drain-region material, and channel-region material have a respective pair of first opposing sides. The channel-region material in the second direction is laterally recessed relative to the top-source/drain-region material and the bottom-source/drain-region material to form a first pair of lateral recesses in the first opposing sides of the channel-region material in individual of the rows. After the first pair of lateral recesses are formed, the lines of the top-source/drain-region material, the channel-region material, and the bottom-source/drain-region material are patterned in the second direction to comprise pillars of individual transistors. The channel-region material of the pillars is laterally recessed in a first direction relative to the top and bottom source/drain-region materials to form a second pair of lateral recesses in a pair of second opposing sides of the channel-region material in individual of the pillars. Individual rows of gatelines are formed in the first direction above the digitlines that individually operatively completely encircle the channel-region material of the individual pillars in the first and second pairs of lateral recesses and that interconnect the transistors in that individual row.

In some embodiments, a method of forming an array of transistors individually comprising a top source/drain region, a bottom source/drain region, a channel region vertically between the top and bottom source/drain regions, and a gate operatively-aside the channel region, with the gate comprising part of a gateline that interconnects a plurality of the transistors in a row, comprises laterally recessing laterally-spaced rows of channel-region material relative to top source/drain-region material and bottom source/drain-region material to form a pair of lateral recesses on opposing sides of the channel-region material in a vertical cross-section in individual of the rows of channel-region material. The pair of recesses are longitudinally elongated in a row direction. Gatelines are formed in a vertically and laterally self-aligning manner in the lateral recesses operatively-adjacent the channel-region material.

In some embodiments, a transistor comprises a top source/drain region, a bottom source/drain region, a channel region vertically between the top and bottom source/drain regions, and a gate operatively-aside the channel region. The top source/drain region has a portion thereof that is directly above the gate in a vertical cross-section.

In some embodiments, a transistor comprises a top source/drain region, a bottom source/drain region, a channel region vertically between the top and bottom source/drain regions, and a gate operatively-aside the channel region. The top source/drain region and the channel region in a vertical cross-section are collectively "T" in shape.

In some embodiments, an array of memory cells individually comprises a transistor. The array comprising rows of gatelines and columns of digitlines, comprises pillars spaced relative one another in a first direction and in a second direction. The pillars individually comprise a top source/drain region and a channel region there-below of individual of the transistors. A bottom source/drain region of the individual transistors is below the channel region. Individual of the columns comprise a digitline electrically coupled to multiple of the bottom source/drain regions of the individual transistors and interconnect the transistors in that individual column. Individual of the rows comprise a gateline crossing above the digitlines. The gateline crosses operatively-aside multiple of the channel regions of the pillars and interconnect the transistors in that individual row. The top source/drain regions individually have a portion thereof that is directly above its crossing gateline there-below.

In some embodiments, an array of memory cells individually comprises a transistor. The array comprising rows of gatelines and columns of digitlines, comprises pillars spaced relative one another in a first direction and in a second direction. The pillars individually comprise a top source/drain region and a channel region there-below of individual of the transistors. A bottom source/drain region of the individual transistors is below the channel region. Individual of the columns comprise a digitline electrically coupled to multiple of the bottom source/drain regions of the individual transistors and interconnect the transistors in that individual column. Individual of the rows comprise a gateline crossing above the digitlines. The gateline crosses operatively-aside multiple of the channel regions of the pillars and interconnect the transistors in that individual row. The top source/drain region and the channel region in a vertical cross-section are collectively "T" in shape.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of memory cells comprising:
    forming lines of top-source/drain-region material, bottom-source/drain-region material, and channel-region material vertically there-between in rows in a first direction, the lines being spaced from one another in a second direction; the top-source/drain-region material, bottom-source/drain-region material, and channel-region material having respective opposing sides;
    laterally recessing the channel-region material on its opposing sides in the second direction relative to the top-source/drain-region material and the bottom-source/drain-region material on their opposing sides to form a pair of lateral recesses in the opposing sides of the channel-region material in individual of the rows;
    after forming the pair of lateral recesses, patterning the lines of the top-source/drain-region material, the channel-region material, and the bottom-source/drain-region material in the second direction to comprise pillars of individual transistors;
    forming rows of gates in the first direction that individually are operatively aside the channel-region material of individual of the pillars in the pairs of lateral recesses and that interconnect the transistors in that individual row; and
    the laterally recessing sequentially comprises:
        forming sacrificial masking material aside the channel-region material, the top-source/drain-region material, and the bottom-source/drain-region material on their opposing sides, the sacrificial masking material being laterally-thicker over the opposing sides of the top and bottom source/drain-region materials than over the opposing sides of the channel-region material;
        removing the sacrificial masking material from being over the opposing sides of the channel-region material to leave the sacrificial masking material over the opposing sides of the top and bottom source/drain-region materials; and
        etching the channel-region material selectively relative to the sacrificial masking material that is over the opposing sides of the top and bottom source/drain-region materials to form the pair of lateral recesses.

2. The method of claim 1 wherein,
    the sacrificial masking material comprises an oxide; and
    the forming of the sacrificial masking material comprising oxidizing the opposing sides of the channel-region material, the top-source/drain-region material, and the bottom-source/drain-region material, and
    further comprising:
        oxidizing the top and bottom source/drain-region materials at a greater rate than rate of oxidizing the channel-region material.

3. The method of claim 1 comprising forming gate insulator in the lateral recesses over the opposing sides of the channel-region material, bottom portions of the top-source/drain-region material, and top portions of the bottom-source/drain-region material immediately prior to forming material of the gates in the pair of lateral recesses.

4. The method of claim 1 comprising:
    forming the top-source/drain-region material and the channel-region material to collectively in a vertical cross-section orthogonal the first direction be "T" in shape; and
    forming the top-source/drain-region material and the channel-region material to collectively in a vertical cross-section orthogonal the second direction be "T" in shape.

5. The method of claim 1 wherein the top-source/drain-region material, the bottom-source/drain-region material, and the channel-region material are in situ doped to their respective dopant concentrations during their respective depositions.

6. The method of claim 1 comprising forming the top-source/drain-region material and the channel-region material to collectively in a vertical cross-section orthogonal the first direction be "T" in shape.

7. The method of claim 6 comprising forming the top-source/drain-region material, the channel-region material, and the bottom-source/drain-region material to collectively in the vertical cross-section be I-beam in shape.

8. The method of claim 1 comprising forming the top-source/drain-region material and the channel-region material to collectively in a vertical cross-section orthogonal the second direction be "T" in shape.

9. The method of claim 8 comprising forming the top-source/drain-region material, the channel-region material, and the bottom-source/drain-region material to collectively in the vertical cross-section be I-beam in shape.

10. An array of memory cells comprising:
pillars spaced relative one another in a first direction and in a second direction, the pillars individually comprising a top source/drain region and a channel region there-below of individual transistors, a bottom source/drain region of the individual transistors being below the channel region;
individual columns comprising a digitline electrically coupled to multiple of the bottom source/drain regions of the individual transistors and interconnecting the transistors in that individual column;
individual rows comprising a gateline crossing above the digitlines, the gateline crossing operatively-aside multiple of the channel regions of the pillars and interconnecting the transistors in that individual row; and
the top source/drain regions individually having a portion thereof that is directly above its crossing gateline there-below.

11. The array of claim 10 wherein the gatelines individually completely encircle the channel region of individual of the pillars in a first horizontal cross-section, the portion comprising an annulus completely encircling the channel region of the individual pillars in a second horizontal cross-section that is above the first horizontal cross-section.

12. The array of claim 10 comprising a gate insulator between the channel region of individual of the pillars and its crossing gateline, the gate insulator extending to be vertically between a top of its crossing gateline and a bottom of the portion of the top source/drain region of the individual pillars that is directly above its crossing gateline in the vertical cross-section.

13. The array of claim 10 wherein the portion is a first portion, the gatelines individually are on two opposing sides of the channel region of individual of the pillars, the first portion is directly above its crossing gateline on one of the two opposing sides, the top source/drain region having a second portion thereof that is directly above its crossing gateline on the other of the two opposing sides.

14. The array of claim 13 wherein the two opposing sides are vertically aligned with two opposing sides of the gate.

15. The array of claim 10 wherein individual of the memory cells comprise a programmable storage device electrically coupled with individual of the top source/drain regions.

16. The array of claim 15 wherein the storage device is a capacitor.

17. The array of claim 16 comprising DRAM.

18. An array of memory cells comprising:
pillars spaced relative one another in a first direction and in a second direction, the pillars individually comprising a top source/drain region and a channel region there-below of individual transistors, a bottom source/drain region of the individual transistors being below the channel region;
individual columns comprising a digitline electrically coupled to multiple of the bottom source/drain regions of the individual transistors and interconnecting the transistors in that individual column;
individual rows comprising a gateline crossing above the digitlines, the gateline crossing operatively-aside multiple of the channel regions of the pillars and interconnecting the transistors in that individual row; and
the top source/drain region and the channel region collectively in a vertical cross-section are "T" in shape.

19. The array of claim 18 wherein the vertical cross-section is a first vertical cross-section, and wherein the top source/drain region and the channel region collectively in individual of the pillars in a second vertical cross-section that is orthogonal the first vertical cross-section are "T" in shape.

20. The array of claim 18 wherein comprising a gate insulator between the channel region of individual of the pillars and its crossing gateline, the gate insulator extending to be vertically between a top of its crossing gateline and a bottom of the portion of the top source/drain region of the individual pillars that is directly above its crossing gateline in the vertical cross-section.

21. The array of claim 18 wherein the top source/drain region, the channel region, and the bottom source/drain region in individual of the pillars collectively in the vertical cross-section are I-beam in shape.

22. The array of claim 21 wherein the vertical cross-section is a first vertical cross-section, and wherein the top source/drain region, the channel region, and the bottom source/drain region in the individual pillars collectively in a second vertical cross-section that is orthogonal the first vertical cross-section are I-beam in shape.

23. The array of claim 18 wherein individual of the memory cells comprise a programmable storage device electrically coupled with individual of the top source/drain regions.

24. The array of claim 23 wherein the storage device is a capacitor.

25. The array of claim 24 comprising DRAM.

* * * * *